(12) United States Patent
Smith et al.

(10) Patent No.: US 7,895,416 B2
(45) Date of Patent: Feb. 22, 2011

(54) RECONFIGURABLE INTEGRATED CIRCUIT

(75) Inventors: Graeme Roy Smith, Bury (GB); Dyson Wilkes, Marlborough (GB)

(73) Assignee: Akya (Holdings) Limited, Dublin (IE)

( * ) Notice: Subject to any disclaimer, the term of this patent is extended or adjusted under 35 U.S.C. 154(b) by 16 days.

(21) Appl. No.: 12/490,608

(22) Filed: Jun. 24, 2009

(65) Prior Publication Data

US 2009/0259824 A1 Oct. 15, 2009

Related U.S. Application Data

(63) Continuation of application No. 11/669,537, filed on Jan. 31, 2007, now Pat. No. 7,571,303, which is a continuation-in-part of application No. 10/685,501, filed on Oct. 16, 2003, now abandoned.

(51) Int. Cl.
*G06F 9/00* (2006.01)
(52) U.S. Cl. ...................................... 712/220
(58) Field of Classification Search ........................ None
See application file for complete search history.

(56) References Cited

U.S. PATENT DOCUMENTS

| | | | | |
|---|---|---|---|---|
| 5,784,636 | A * | 7/1998 | Rupp | 712/37 |
| 5,915,123 | A * | 6/1999 | Mirsky et al. | 712/16 |
| 5,956,518 | A * | 9/1999 | DeHon et al. | 712/15 |
| 7,000,137 | B2 * | 2/2006 | Sivaraman et al. | 713/500 |
| 2002/0138716 | A1 * | 9/2002 | Master et al. | 712/227 |
| 2003/0040896 | A1 * | 2/2003 | McWilliams et al. | 703/13 |
| 2004/0103265 | A1 | 5/2004 | Smith | |
| 2006/0010306 | A1 | 1/2006 | Saito et al. | |
| 2006/0101237 | A1 * | 5/2006 | Mohl et al. | 712/201 |

OTHER PUBLICATIONS

Brynjolfson, I. etal., Dynamic Clock management for Low Power Applications in FPGAs, 2000, IEEE, pp. 139-142.*
Brayton et al, "Pla-Based Regular Structures and Their synthesis", vol. 22, No. 6, Jun. 1, 2003, pp. 723-729, IEE Transactions etc.
Sankaralingam et al, "Exploiting ILP, TLP, and DLP With the Polymorphous Trips Architecture", Jun. 9, 2003, IEE Comp. Soc. US, pp. 422-433.

* cited by examiner

*Primary Examiner*—Eric Coleman
(74) *Attorney, Agent, or Firm*—Dennison, Schultz & MacDonald

(57) ABSTRACT

A reconfigurable integrated circuit is provided wherein the available hardware resources can be optimised for a particular application. Dynamically reconfiguring (in both real-time and non real-time) the available resources and sharing a plurality of processing elements with a plurality of controller elements achieve this. In a preferred embodiment the integrated circuit includes a plurality of processing blocks, which interface to a reconfigurable interconnection means. A processing block has two forms, namely a shared resource block and a dedicated resource block. Each processing block consists of one or a plurality of controller elements and a plurality of processing elements. The controller element and processing element generally comprise diverse rigid coarse and fine grained circuits and are interconnected through dedicated and reconfigurable interconnect. The processing blocks can be configured as a hierarchy of blocks and or fractal architecture.

44 Claims, 17 Drawing Sheets

2 = 20A/20B ☐ Dedicated Or Shared Resources

25 ▩ Reconfigurable Interconnect Controller

21 —— Reconfigurable Interconnect

AC3 Exponent Decoding Pseudo Code
expacc = gexp[i];
dexp[i] = truncate (expacc/25);
dexp[i] = dexp[i]-2;
aexp[i] = prevexp + dexp[i];
prevexp = aexp[i];
FIG. 18
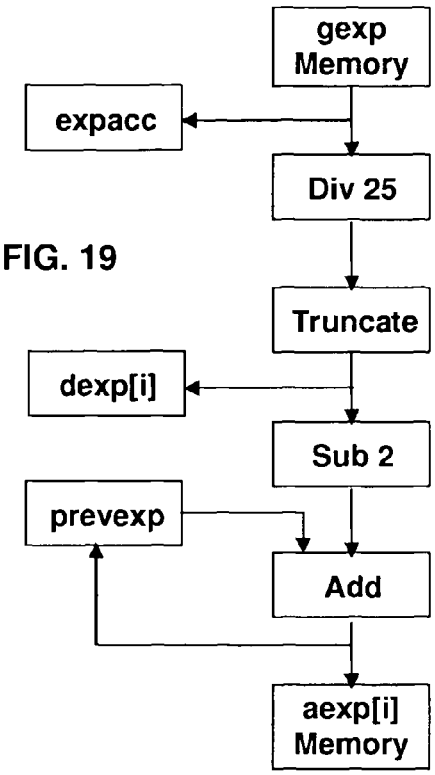
FIG. 19
Routing Configuration Stage [i]
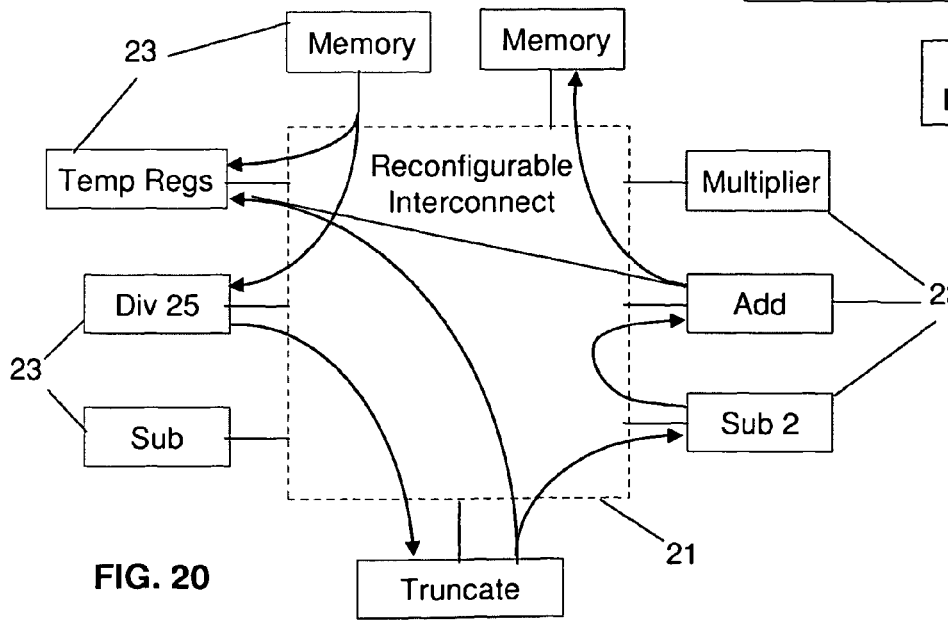
FIG. 20

AC3 Exponent Decoding Pseudo Code
expacc = expacc − (25* dexp[i]);
dexp[i+1] = truncate (expacc)/5);
dexp[i+1] = dexp[i+1]-2;
aexp[i+1] = prevexp + dexp[i+1];
prevexp = aexp[i+1];
FIG. 21
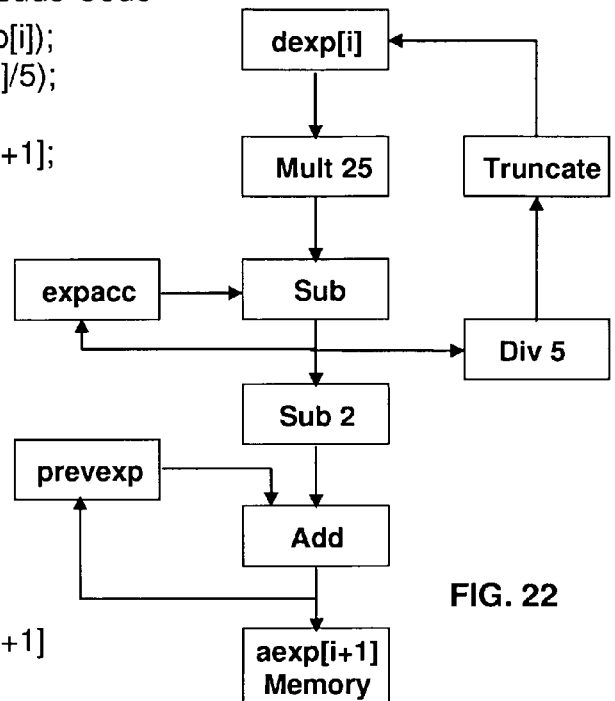
FIG. 22
Routing Configuration Stage [i+1]
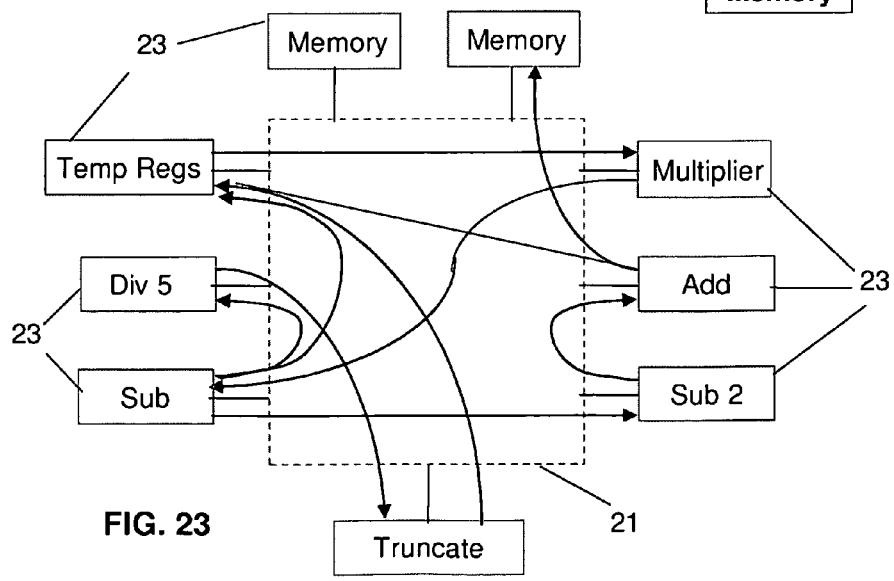
FIG. 23

RECONFIGURABLE INTEGRATED CIRCUIT

This application is a continuation of Ser. No. 11/669,537 filed Jan. 31, 2007, which is a continuation-in-part of Ser. No. 10/685,501, filed Oct. 16, 2003, the contents of both said prior applications being incorporated herein by reference.

BACKGROUND OF THE INVENTION

In today's competitive multimedia marketplace Integrated Circuit (IC) suppliers, Original Equipment Manufacturer (OEMs) and network/service providers are faced with an array of dilemmas. Functional integration, dramatic increases in complexity, new technologies and every changing and competing standards together with increased time to market pressures are making the selection of the right functionality-cost mix ever more difficult. Furthermore, end customers are demanding more sophisticated feature sets, which in turn require an enormous amount of additional processing power.

The constant introduction of new standards means conventional equipment is effectively obsolete before it leaves the factory. This is a particular concern to network/service providers, such cable, satellite, terrestrial television providers and mobile phone operators as they significantly subsidize the cost of this equipment to the consumer. Consequently, the introduction of new equipment erodes their profits. Therefore, having equipment that could adapt to changing standards, upgrades and new applications via the Internet and or broadcast channel would be a significant advantage.

To further compound the issue the introduction of new European environmental legislation in 2004 will make OEMs responsible for waste management. Waste of Electrical and Electronic Equipment (WEEE) and Restrictions of the use of certain Hazardous Substances (RoHS) legislation will mean manufacturers of consumer goods will need to adopt a more environmentally friendly manufacturing strategy. They will also be responsible for product recycling.

At the IC device level, it is becoming increasing difficult with existing IC technologies and design methodologies for designers to meet the demands outlined above. Several IC technologies exist, but they all have disadvantages and are not optimised for a particular application.

Application Specific Integrated Circuits (ASICs) have their circuits and hence their functionality fixed at manufacture and so can't be used for new or different applications. They have long development cycles and require huge upfront Non-Recurring Engineering (NRE) costs. This makes them prohibitively expensive, especially for lower cost applications.

Microprocessors and Digital Signal Processors (DSPs) provide a degree of flexibility with regards reconfiguration through software. However, these devices still employ fixed or rigid hardware and as they are general purpose devices are not optimised to a particular application. This is particularly true when compared to a parallel hardware solution. A microprocessor can only process one instruction at a time and is therefore much slower and inefficient. While operating, many of their circuits are not being utilized. This is a waste of expensive silicon real estate and increases power consumption. To increase the throughput, designers can employ more than one processor. However, this just compounds the cost, power efficiency and area issues.

Current programmable logic devices, such as Field Programmable Gate Arrays (FPGAs), provide a better solution. However, FPGAs are very expensive and are a general-purpose device consisting of an array of uniform programmable element, usually based on look-up tables (LUTs) interconnected using programmable interconnect. Consequently, they are not optimised for a particular application and hardware utilization can be poor. Though they allow reconfiguration in the field the process is slow and cumbersome and doesn't allow real-time reconfiguration.

Many multimedia processes require several complex digital signal-processing algorithms. Each algorithm itself comprises of many sub-functions some of which can be executed in parallel. Some of these sub-functions or processes, such as digital filtering, convolution, Fast Fourier Transforms (FFTs), Discrete Cosine Transforms (DCTs), require many arithmetic and logical computations per data sample. These arithmetic and logical computation operations tend to be the same operation executed many times, such as multiply and accumulate (MAC) operations. Consequently, the hardware to implement these different processes is very similar and can be optimised and shared for these applications. Exploiting the parallel form of certain algorithms by implementing hardware to perform the separate parallel functions simultaneously provides hardware acceleration of the algorithm enabling it to be executed in a quicker time. A goal of the present invention is to provide processing resources in the reconfigurable integrated circuit that can execute functions in parallel and provide hardware acceleration.

FIG. 2 is a logical block diagram that outlines the processing and resource requirements for a generic multimedia system or algorithm 100. The algorithm can be partitioned into several distinct functions each having its own processing and resource requirements. The algorithm input block 101 operates at a lower rate than the core functions 103, but tends to require shared resources. Received data needs to be formatted or pre-processed 102 before being transferred to parallel algorithmic resources 103. These are dedicated resources, which operate at high frequencies that are many times the data sample rate. Data is then post processed or merged 104 before being output 105 via one or a plurality of output channels. These latter two functions require medium processing rates and shared resources.

As well as parallel processing an algorithm may contain certain sub-functions that are performed sequentially. Each subsequent sub-function requiring data to be processed by the previous sub-function. In an ASIC or FPGA design each sub-function will require dedicated circuitry. However, by reconfiguring the available logic resources the reconfigurable logic can be altered in real-time to implement each of the sequential sub-functions. Consequently, reducing the number of logic gates and silicon real estate. It is another goal of the present invention to provide a reconfigurable integrated circuit, which optimises the logic resources for a particular application.

Another problem facing integrated circuit designers is the choice of device interfaces. There are many interface standards available several of which are constantly being upgraded. One solution is to implement several interfaces on a device to enable it to be employed in several different applications. However, this is costly and inefficient especially when an interface requires wide address and data buses. One of the goals of the present invention is to provide reconfigurable logic resources to allow a designer to implement different interfaces using the same logic resources.

Another goal of the present invention is to provide logic resources with varying degrees for reconfiguration rate. Some reconfigurable resources only need to be configured at the start of device operation, such as interface type, clock rate and memory sizes. Other algorithmic blocks implement functions, which perform operations at a rate lower than the maximum clock frequency used by a particular device. These algorithmic blocks tend to perform similar operations. Therefore, several different algorithms can be implemented by dynamically sharing common logic resources.

This concept can be extended for implementing finite state machines. FIG. 3 shows a generic block diagram of a finite state machine. The current state 906 is stored in register 901 and is clocked using clocking signal 909. Current state 906 together with inputs 904 are input into the next state generation logic 900 to determine the next state 905 and actions. At the next clock cycle the next state vector 905 in transferred to the current state register 901. Likewise, any outputs are registered in register 902. In some finite state machines variables 908 need to be updated at certain times. Variable update logic 903 is used to perform these calculations. The finite state machine can be reset using reset signal 910.

The stages of operation are shown in FIG. 4. For each state there can be several test conditions. Each of these is tested 9A. Then the appropriate one is selected 9B. Based on the selected test condition the next state, outputs and actions are selected 9C. At the start of the next clock cycle the next state, outputs and actions are updated 9D.

However, one of the problems of implementing finite state machines is that logic circuitry is required to perform functions associated with each state. This also means these individual circuits are dissipating power even if they are not being used as in an ASIC or FPGA implementation. For a complex state machine with many states this requires a lot of silicon resources. A solution to this problem is to implement the logic for each state only when it is required. By dynamically reconfiguring and sharing logic resources a finite state machine can be implemented in a smaller area with reduced power consumption.

One of the disadvantages of using Field Programmable Gate Arrays (FPGAs) is that they are not optimised for a particular application due to replication of uniform programmable logic elements. Yet another goal of the present invention is to provide a reconfigurable integrated circuit that employs non-uniform or a diverse range of rigid elements and programmable-rigid elements, which target a particular group of applications, such as audio, video and telecommunication applications. The term rigid element means a hardwired circuit dedicated to implementing a particular function or functions. The hardwired circuit can be "constructed" from one or more hardwired sub-circuits. The term programmable-rigid element means a circuit that contains hardwired circuitry, but certain parts of the circuitry can be reconfigured via memory means so the circuit can implement one of a plurality of similar functions. This includes a micro-coded controller. The term reconfigurable element refers to a block of logic that can be reconfigured to implement a wide variety of combinatorial and or synchronous logic functions. Though synchronous logic is normally employed there is no reason why asynchronous logic (also referred to as clockless logic or self-timed logic) cannot be employed in the hardwired circuits used in the reconfigurable integrated circuit. There are several advantages to using asynchronous logic, namely reduced power consumption, as the logic will consume zero dynamic power when there is no logic activity, and a low electromagnetic signature because of the diffuse nature of digital transitions within the chip. This makes these devices an attractive option for use in portable or battery operated applications.

Video processing tends to work on 8-bit data values as in MPEG2. However, audio applications require a greater range of bit widths. Compact Disc (CD) data was originally set at 16-bits. However, the sample resolution for new audio systems has changed to 18-bits, 20-bits and now 24-bits. In voice data systems data is coded and transmitted serially. Consequently, fine grain bit resolution processing is required. Therefore, a reconfigurable integrated circuit targeted at audio applications will need to implement both coarse and fine grain processing elements.

Several attempts have been made to provide an integrated circuit device solution, which provides the speed of parallel hardware with the flexibility of software. However, these solutions have had many limitations. Some have provided replicated coarse grained processing elements to target particular digital signal processing problems and therefore lack the versatility of a full reconfigurable solution.

For example, Marshall et al. EP0858167 (priority EP 19970300562), entitled "Field Programmable Processor Arrays", Jan. 29, 1997, describes a device in which processing units can be densely connected efficiently and in a flexible way so they can be interconnected. However, the processor array is made up from the same arithmetic logic units (ALUs) repeated many times. Each ALU is 4-bits wide and control functions seem limited. There are no diverse computational blocks. The device is geared to data path processing and in particular repetitive operations. The device has specific applications and does not provide functions for implementing control, interfaces, input, output, finite state machines and general reconfiguration operations, as required in a more general purpose device.

Tavana et al. U.S. Pat. No. 6,094,065, entitled "Integrated Circuit with Field Programmable and Application Specific Logic Areas", issued Jul. 25, 2000, discloses use of a field programmable gate array in a parallel combination with a mask-defined application specific logic area. The intention is to provide post-fabrication reconfiguration logic means to enable bug fixes and error corrections. However, this approach is limited and suffers from the disadvantages associated with ASICs and FPGAs, such as low logic utilization, greater power consumption, low speed and high cost.

Master et al. U.S. Pat. No. 20020138716, entitled "Adaptive integrated circuitry with heterogeneous and reconfigurable matrices of diverse and adaptive computational units having rigid, application specific computational elements", issued Sep. 26, 2002, describes an integrated circuit which employs rigid hardware elements which can be reconfigured in real time. However, there are several disadvantages to this approach. Firstly, each computation unit comprises several different rigid computational elements and a single computational unit controller. A plurality of computation units is used to form a matrix, which is then replicated many times to form an array of matrices. This is an inefficient use of hardware resources as the computational unit controller will only be using one of the plurality of computational elements depending on the algorithm be implemented. Therefore, the hardware utilization can be low. Secondly, the computational unit controller can only access the computational elements in its own computation unit. There is no sharing of resources by different computational unit controllers. Again, this is inefficient. Thirdly, the same computational elements and matrices are repeated across the integrated circuit to form a large array. There is no grading of reconfigurable resources across the integrated circuit in relation to the processing and resource requirements for different functions used to implement a system, such as input interfaces, output interfaces, parallel processing and protocol processing and data formatting.

De Hon (U.S. Pat. No. 5,956,518) describes a device architecture, which is based around a two dimensional array of Basic Functional Units or BFUs. All the BFUs are identical and a BFU is smallest logic unit from which more complex processing units can be built. There are many disadvantages with this architecture. Firstly, there is a large area overhead. Each BFU must contain all the circuitry required to perform any function, on the off chance that it might be required. This is also a disadvantage to similar array procesors. A BFU can be both a datapath unit or part of a control unit and the BFUs are programmed to implement specific functions. For example, a whole BFU is programmed to implement a Program Counter (PC) of a control unit. The logic and hence the silicon area overhead is therefore greater than it would be if this function was implemented using dedicated logic. A Program Conunter is just a basic counter. The same is true for all the other programmed versions of a BFU. If it is programmed to be a memory unit, then the rest of BFU circuitry is wasted as it is not being used. As this approach will lead to a greater silicon area and silicon costs. Also, the logic that isn't being used directly, will probably be dissiapating power. Also, a BFU is a general purpose unit and not optimised for a particular application. Consequently, much of the logic is used to input and output signals, be used for other decodes and hence adds to the number of levels of logic a signal must pass to get between BFUs. This therefore degrades the performance of the architecture and adds to the path delays. The output of each BFU is registered so they can not be used to form concatenated datapath functions.

There is also a large routing overhead associated with each BFU. For example, each 8-bit BFU requires 8×(30×8-bit) buses or 240×8-bit buses per BFU.

The BFUs implement many basic logic and arithmetic functions, but they are still very limited. They take several cycles to implement a multiply. This is a serious disadvantage as most Digital Signal Processing (DSP) algorithms rely heavily on multiply-accumulate operations and the overall performance is degraded as it will take several clock cycles to implement a particular function.

Consequently, there is a need for a reconfigurable integrated circuit that provides the speed of parallel hardware, as employed in an ASIC device, with the reconfigurable flexibility of software for a targeted application. The reconfigurable integrated circuit will allow dynamic sharing of resources, both rigid and programmable-rigid, to maximise hardware utilization, employ different grades of processing resources depending on the algorithmic sub-function level within a system and be reconfigurable in both real-time and non real-time. These reconfigurable logic devices enable the same device to implement many different functions and standards in hardware. They effectively evolve with changing standards and so reduce obsolescence. The result is a reconfigurable integrated circuit solution with orders of magnitude functional density improvement over traditional integrated circuit solutions and one that is more efficient in terms of cost, power consumption and use of silicon real estate.

SUMMARY OF THE INVENTION

The present invention provides a reconfigurable integrated circuit comprising a plurality of controller elements, the plurality of controller elements including a first controller element and a second controller element, the first controller element having a certain architecture and a second controller element having a certain architecture, the first architecture being different from the second architecture; a plurality of processing elements, the plurality of processing elements including a first processing element and a second processing element, the first processing element having a certain architecture and a second processing element having a certain architecture, the first architecture being different from the second architecture. Reconfigurable interconnection means is used to connect and transfer data and control signals between processing elements. It is also used to interconnect processing elements and controller elements. The reconfigurable interconnection means can be dynamically reconfigured in real time and non real time providing different interconnection configurations between processing element and controller element. One or plurality of the controller elements can control the reconfigurable interconnect and implement different interconnection configurations both on a local block basis or inter-block basis.

BRIEF DESCRIPTION OF THE DRAWINGS

FIG. 18 details a section of pseudo code for implementing an AC3 function.

FIG. 19 shows the corresponding data flow graph for the AC3 function.

FIG. 20 shows how various processing elements are concatenated using the reconfigurable interconnect to implement the AC3 function in stage[i].

FIG. 21 details another section of pseudo code for implementing a different, but related AC3 function.

FIG. 22 shows the corresponding data flow graph for the second AC3 function.

FIG. 23 shows how various processing elements are concatenated using the reconfigurable interconnect to implement the AC3 function in stage[i+1].

DETAILED DESCRIPTION OF THE INVENTION

Figure 1:
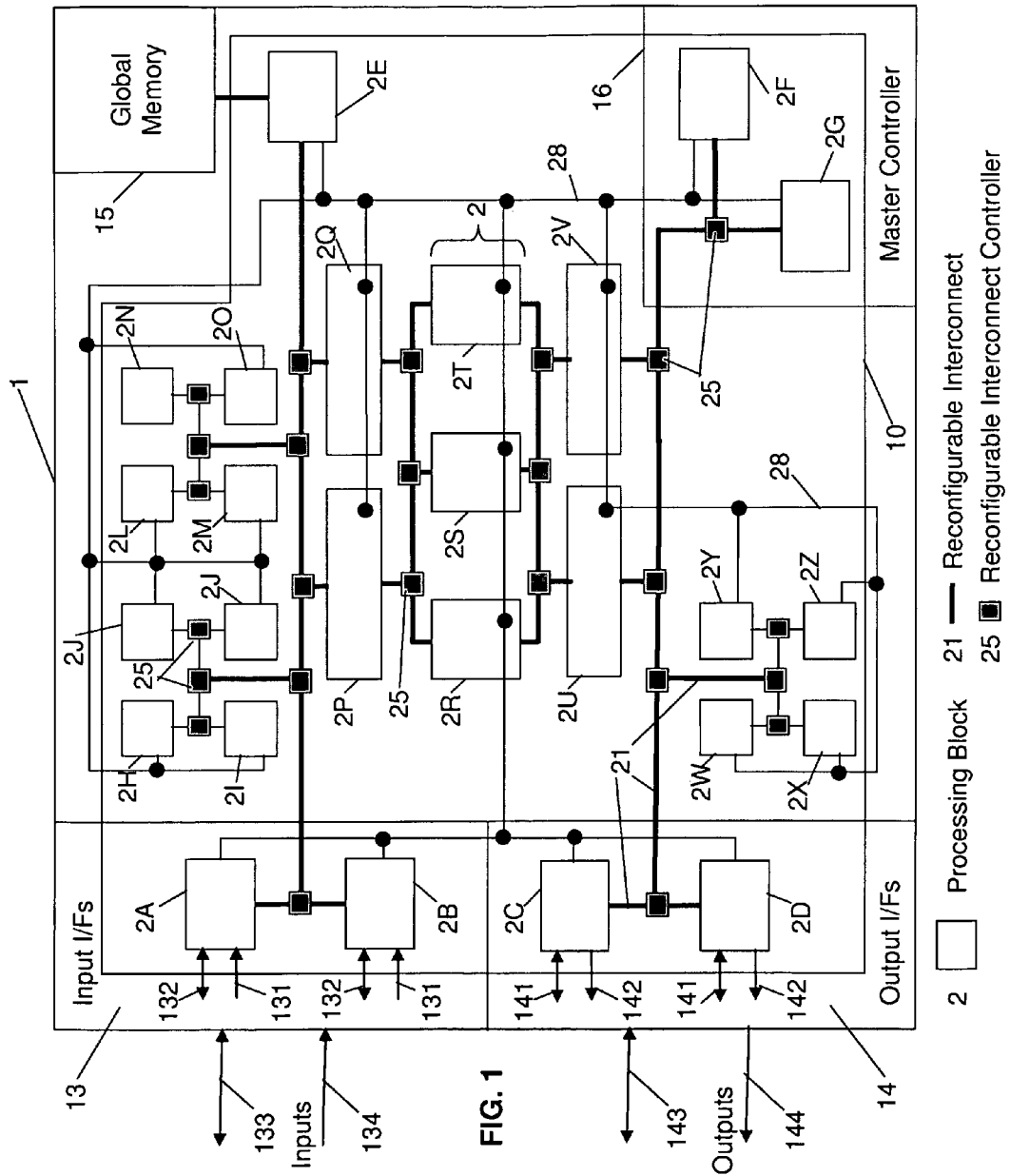
FIG. 1 shows a logical block diagram of a reconfigurable integrated circuit having one level of processing block.
Figure 2:
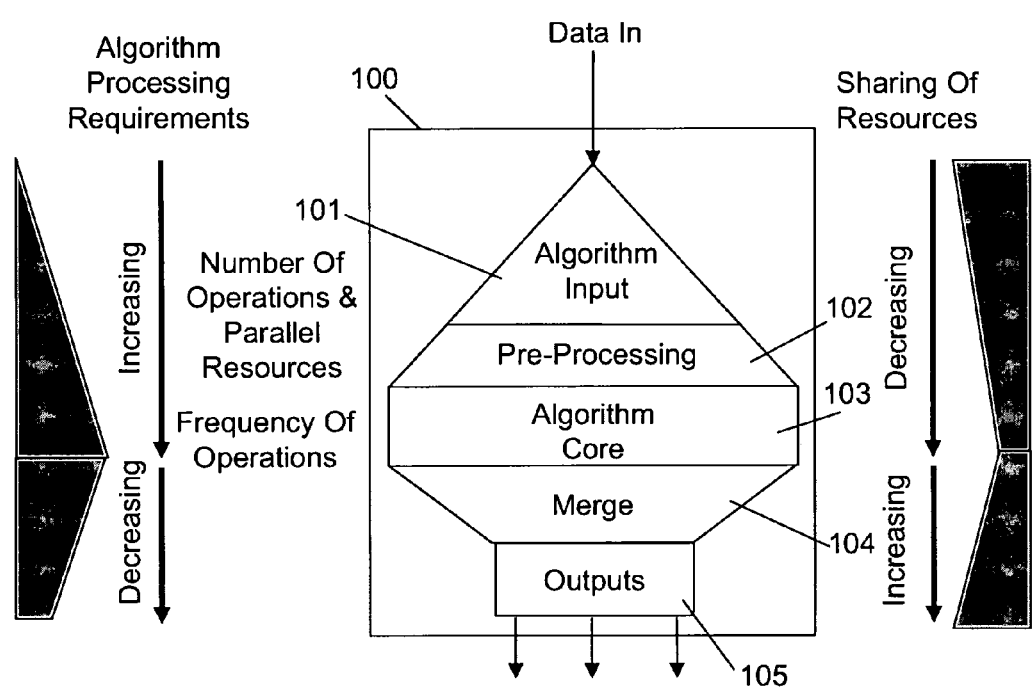
FIG. 2 is a logical block diagram showing the sub-functions of a generic algorithm and the details the processing and resources requirements employed at various stages in the algorithm.
Figure 3:
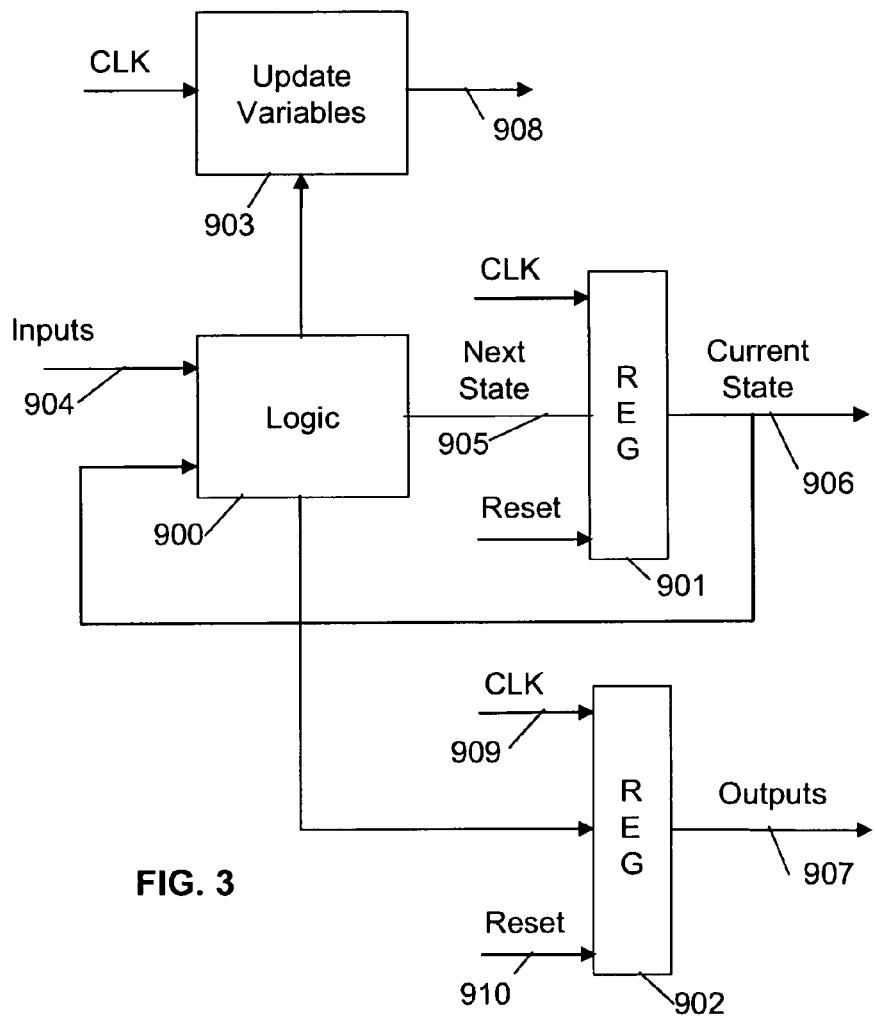
FIG. 3 is a generic block diagram of a finite state machine.
Figure 4:
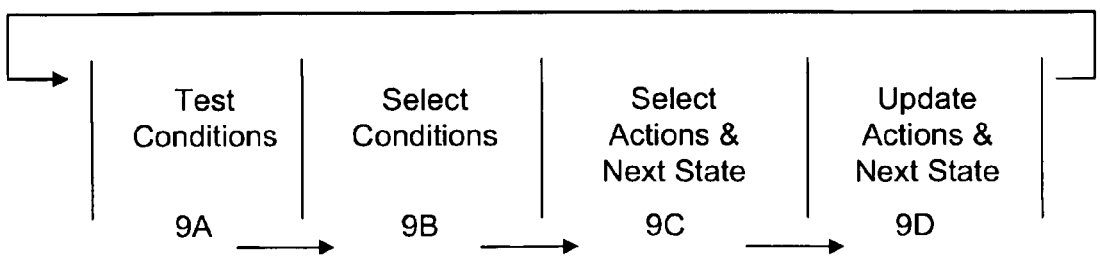
FIG. 4 outline the different stages performed by a finite state machine.

FIG. 1 shows a preferred embodiment of the present invention. The apparatus 10, referred to herein as a Reconfigurable Resource Core ("RRC") 10, is preferably embodied as an integrated circuit 1, or as a portion of an integrated circuit having other components, such as memory 15 and or an embedded RISC core (not shown). The RRC 10 comprises one or a plurality of processing blocks 2, labelled as 2A through 2Z in FIG. 1 (individually and collectively referred to as processing blocks 2). The processing blocks 2 can communicate via reconfigurable interconnect 21. The reconfigurable interconnect 21 represents a group of buses. There is at least one bus per processing element 23 and a processing element 23 can have a plurality of output buses and individual signals. The processing element's output buses are collectively known as the reconfigurable interconnect 21. Specific routing selections are determined by the reconfigurable interconnect controllers 25. Data transferred between the processing blocks 2 can be both control and data information. The processing blocks 2 can take on two forms namely a shared resource block 20A or a dedicated resource block 20B (individually and collectively referred to as processing blocks 2). When implemented as an integrated circuit 1 one or more of the processing blocks 2 can be employed as input interface circuitry 13 and or output interface circuitry 14. Data is transferred to the input interface 13 via input interconnect 133. Interface control signals 134 are used to control the flow of data. Likewise, data is transferred from the output interface 14 using output interconnect 143. Interface control signals 144 are used to control the flow of data. A master controller 16 is used to configure and reconfigure the processing blocks 2, the micro-code memory 520 of each controller element 22 and reconfigurable interconnect 21. Reconfiguring of these blocks by the master controller 16 means the contents of the memories associated with these blocks are updated with new configuration and program data. The configuring and reconfiguring of the processing blocks 2, the micro-code memory 520 of each controller element 22 and reconfigurable interconnect 21 by the master controller 16 can be performed in both real time and non real time. In real time mode, the updating on the configuration memories, for example the micro-code memory 520, is performed during device operation and at a rate that enables the selected algorithms to be implemented correctly to process the required data in the desired time event without causing any data corruption, timing errors or distortion to any input or output data. In an embodiment of the invention, the micro-code memory 520 can be double buffered (not shown) enabling the master controller to 16 to update the micro-code memory 520 while it is also being accessed by the micro-code controller 510. Dedicated interconnect 28 provides means for a master controller 16 to communicate and transfer both control and data information to the various configuration memories within the RRC 10. The master controller 16 can write data to a reconfigurable memory and read from a reconfigurable memory.

The configuration of the plurality of reconfigurable interconnects 21, reconfigurable interconnect controllers 25 and processing blocks 2 is performed by a master controller 16. However, as explained later processing block interconnect 21 can be controlled locally by controller elements 22. The master controller 16 can be a dedicated unit or be implemented from one or more reconfigurable processing blocks 2, as outlined in FIG. 1. In addition, the master controller can be implemented by an external processing unit, such as a microprocessor or ASIC. Global memory means 15 can be any semiconductor memory means, such as RAM, ROM, SRAM, DRAM, EEPROM or FLASH memory. It can also be a combination of these memory technologies. The global memory 15 can be used to store data and configuration data for implementing different algorithms. The configuration data is used by each processing block 2 to implement one or a plurality of functions and algorithms. By loading and re-loading processing block 2 with new configuration data, the same processing block 2 can be used to implement different functions. This functional overlaying means that the same reconfigurable logic circuits can be configured to implement different functions. Consequently, this saves silicon area as individual logic circuits don not have to be fabricated to implement the separate functions.

Figure 5:
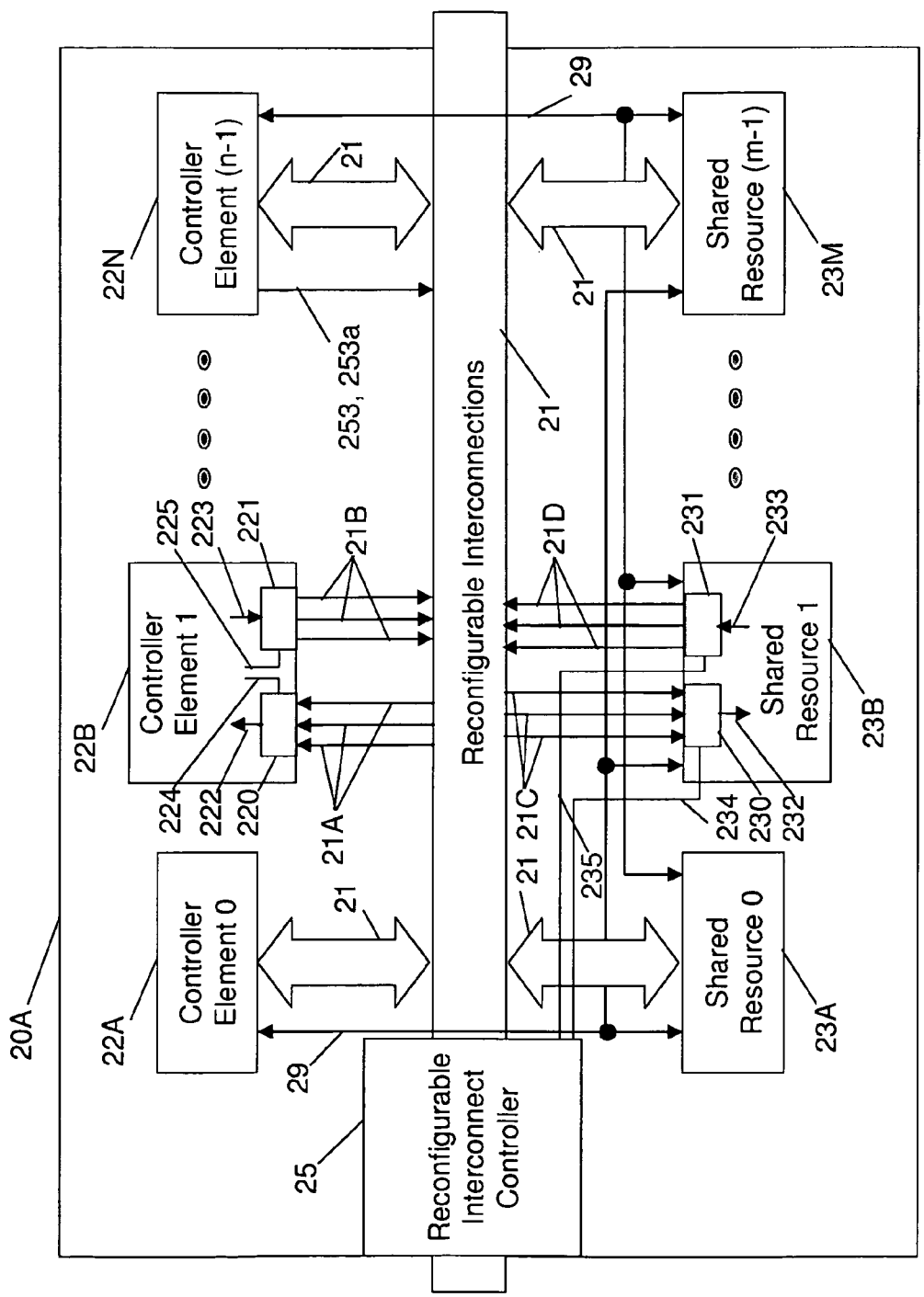
FIG. 5 shows a particular type of processing block that employs shared resources.
Figure 6:
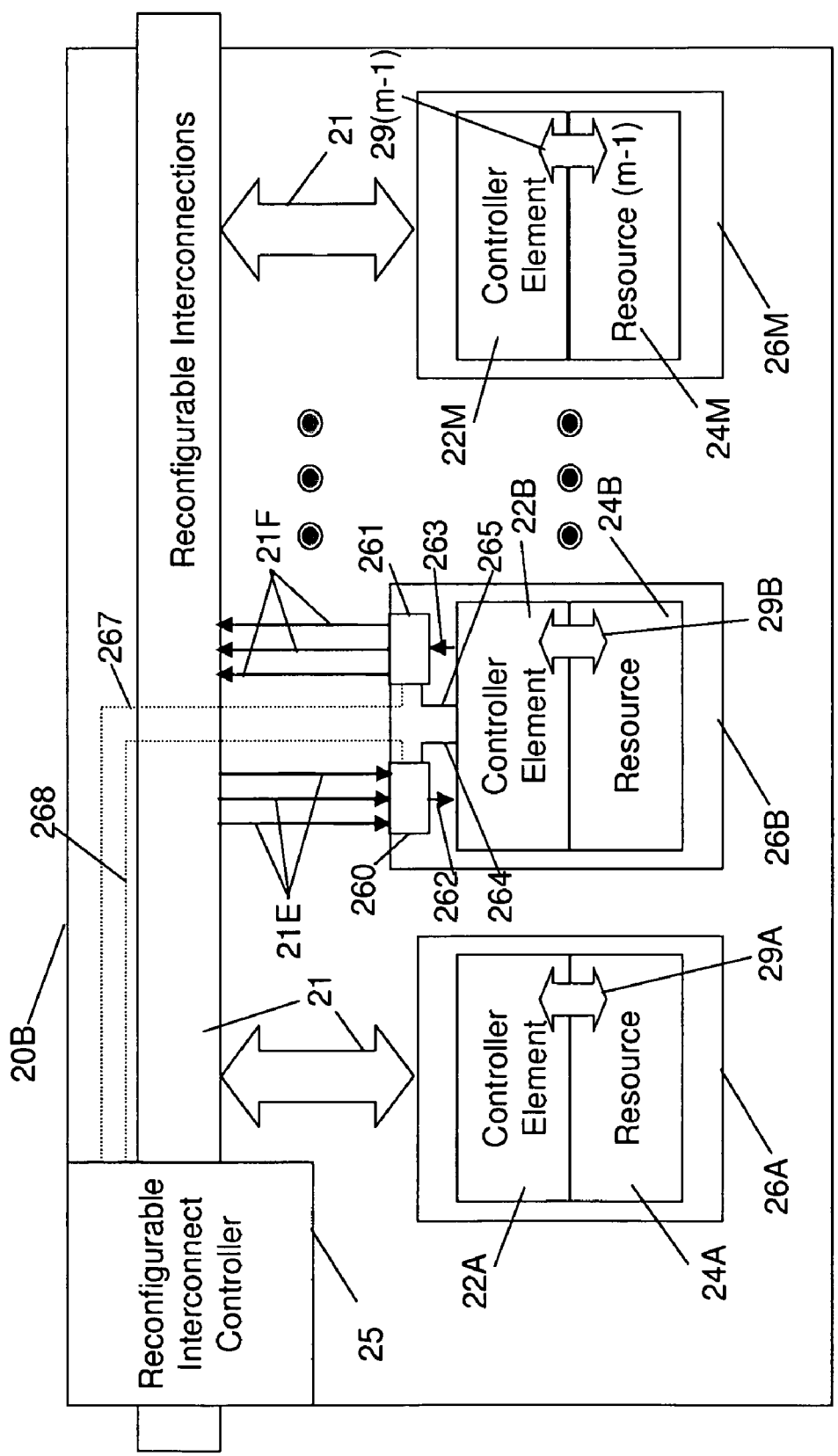
FIG. 6 shows a particular type of processing block that employs dedicated resources.

As outlined above, the processing block 2 can take two forms. FIG. 5 shows a logical block diagram of the shared resource processing block 20A. FIG. 6 shows a logical block diagram of a dedicated resource block 20B.

The shared resource block 20A comprises one or a plurality of controller elements 22, shown as controller elements 22A through 22N (individually and collectively referred to as controller elements 22), one or a plurality of shared processing elements 23, shown as processing elements 23A through 23M (individually and collectively referred to as processing elements 23), dedicated interconnect 29 for implementing direct connections between a controller element 22 and one or more processing elements 23, a reconfigurable interconnect 21 which provides means to allow any controller element 22 to communicate with any processing element 23, and a reconfigurable interconnect controller 25 to configure the desired local interconnect configuration and allows communication with other processing blocks 2. The reconfigurable interconnect also allows communication (data transfer) between any of the processing elements 23. That is, any processing element's output can be connected to the input of any processing element input, including its own input. In a preferred embodiment, the reconfigurable interconnect 21 can be controlled and configured directly by one or a plurality of controller elements 22. The operation of the shared resource block 20A will be described in more detail later. The reconfigurable interconnect 21 also allows the output from one processing element 23 to be input to any other processing element 23. This allows many processing elements to be concatenated (outputs connected to one or more inputs) in different ways to form different datapaths and hence algorithmic functions. The reconfiguring of the different processing element 23 concatenation configurations can be changed on a cycle-by-cycle basis.

The processing elements can take several forms and implement arithmetic, logical and storage functions or any combination of these functions. Processing elements 23 that perform a single operation, such as a multiplier processing element or a group for related functions, such as logical ands, ors, nands, nors and inverts are referred to as basic processing elements. Processing elements that have a combinatorial logic datapath (also referred to as a combinational logic datapath) from their inputs to their outputs do not require a clock to transfer the data from their inputs to their outputs. The only delays through a combinatorial logic based processing is the delays through the various logic gates that implement the processing elements functions. However, combinatorial processing elements can contain local registers for storing constants, locally calculated variables or results output from other processing elements. These registers will require clocks to store the input data. As outlined above, and mentioned in more detail later, processing elements with combinatorial datapaths can be concatenated so the output of one processing element can be input to one or a plurality of other combinatorial processing elements. This configuration allows a combinatorial logic datapath to be formed, the overall function of the combinatorial logic datapath being that of the of the functions of the individual processing elements applied in concatenated order. The overall result and any intermediate results being stored locally in processing element registers, memory means or output interface registers. The overall function of the combinatorial logic datapath being calculated in a single clock cycle. This configuration then allows many operations to be performed in a single clock cycle and saves storing intermediate results as in pipelined processors, which can only perform one function at a time per pipeline stage. This also has the advantage of saving on registers and reducing the clock frequency. The inputs to the processing elements 23 coming from local registers, the outputs of other processing elements 23, memory means, input interface means or any combinations of these input sources.

The use of combinatorial logic in the datapaths makes this architecture an ideal candidate for asynchronous logic implementation, including all the control and instruction sequencing logic. There are several ways to implement asynchronous logic circuits, including bounded delay asynchronous circuits, delay-insensitive circuits, Differential Cascode Voltage Switch Logic (DCVSL) and Quasi Delay-Insensitive (QDI) asynchronous circuits. An asynchronous Reconfigurable Resource Core 10 can be designed using any of these asynchronous design techniques allowing the design advantages mentioned previously to be utilized in an asynchronous dynamically reconfigurable logic core or device. This allows the reconfiguration and related algorithm processing to be performed asynchronously.

Processing Elements 23 can also output status signals whose value depends on the operation or operations of a particular processing element's functionality. For example, a comparator processing element could output three status signals, A greater than B, A equal B and A less than B. These status signals can also to routed to the control inputs of other processing elements 23 via the reconfigurable interconnect and connected via a direct interconnection.

When a combinatorial datapath function is formed by concatenating a plurality of processing elements the result of the overall function my be dependent on several intermediate conditions. For example, if the result of an intermediate operation (output of a processing element) is a certain value then the datapath may need to be altered to produce the desired result. This could occur if a value needed to be threshold limited to a certain value and the threshold limit is switched in to replace the calculated value that is either greater than or less than a desired value. The control for such switching being taken from status signals from intermediate processing elements. This switching or re-routing of datapaths being performed on the fly within a single clock cycle. Therefore, the reconfigurable interconnect and or datapath routing is dynamically controlled in real time based on the results of intermediate results of processing elements within a combinatorial datapath. This adaptive approach is advantageous as it save extra storage and control processing, which would require extra instructions and time to execute.

The dedicated resource block 20B comprises one or a plurality of dedicated elements 26, shown as dedicated elements 26A through 26M (individually and collectively referred to as dedicated elements 26), a reconfigurable interconnect 21 which provides means to allow any dedicated element 26 to communicate with any other dedicated element 26 within the same processing block 2, and a reconfigurable interconnect controller 25 to configure the desired interconnect configuration and allows communication with other processing blocks 2. Each dedicated element 26 further comprises a controller element 22, shown as controller elements 22A through 22M (individually and collectively referred to as controller elements 22), a processing element 24, shown as processing elements 24A through 24M (individually and collectively referred to as processing elements 24) and dedicated interconnect 29 to transfer control and data information between the controller element 22 and the processing element 24. Many digital signal-processing algorithms use similar arithmetic functions that are repeated many times. For example, algorithms to implement of digital filters, Fast Fourier Transforms (FFTs), convolution, correlation and discrete cosine transforms (DCTs) require a Multiply and Accumulate (MAC) operation to be performed many times on data samples. Consequently, a rigid processing element implementing a MAC type operation can then be used to implement these different digital signal-processing functions. The operation of the dedicated resource block 20B will be described in more detail later with reference to FIG. 10 as a specific example of a dedicated resource.

The processing elements 23A through 23N in FIG. 5 can be rigid circuits, such as full custom logic and standard cell logic employed in ASICs, to implement one of a plurality of fixed functions. These functions include arithmetic functions (both fixed point and floating point), logical functions, logarithm conversion, anti-logarithm conversion, shifters, comparators, memory, combinatorial logic, finite state machines and polynomial finite state machines. In addition, each processing element 22 within a shared processing block 20A can have different bit widths. They can also implement the same function. For example, due to the computational requirement of the shared resource a processing block may contain four processing elements 22 hardwired as 16×16 bit multipliers, two processing elements 22 hardwired as logical elements, a processing element 22 hardwired as a logical element and a processing element 22 hardwired as a shifter.

Controller elements 22 are implemented using rigid logic (rigid architectures) or programmable-rigid (programmable-rigid architecture) resources, such as a micro-coded controller. A specific example is described later and shown as block 501 in FIG. 10. Controller elements can be implemented in different ways and can be used to control the reconfigurable interconnect 21 directly allowing different interconnection configurations. To reduce silicon area and any timing delays, a controller element 22 is a self contained controller circuit designed using dedicated logic functions as shown in block 501 in FIG. 10. Such a controller element can perform all the desired reconfigurable instruction sequences and as such does not require the addition of extra logic blocks. A controller element 22 is in effect a fundamental or irreducible component. The advantage of using a dedicated controller element 22 is that all the internal functions are implemented using dedicated logic and there is no need to "construct" a controller from other non-dedicated functions or blocks. This, therefore, reduces the number of logic gates required to implement the controller, there is no need for any reconfigurable interconnect to route signals between non-dedicated blocks to form such a controller and hence the timing delays are reduced. In addition, implementing a controller function by combing a group of non-dedicated function blocks means that much of the circuitry will not be used as only certain logic circuits will be used to implement specific controller functions. For example, a non-dedicated function block that contains memories and routing multiplexers will not require the use of these memories if the non-dedicated function block is programmed to implement a Program Counter (PC) of a controller. Consequently, reconfigurable devices that employ an array of the same multi-functional Arithmetic Logic Units (ALUs) and group several of these ALUs to from a controller will suffer from increased gate counts, silicon area and power dissipation.

Controller elements 22 are different from processing elements 23 and are not used to implement a datapath function. A controller element is a basic building block and is not formed by combining other processing elements or control elements.

In a preferred embodiment the number of controller elements 22 is greater than the number of processing elements 23 for a particular shared processing block 20A. The controller elements 22 being clocked at a lower frequency than the processing elements 23. This arrangement will allow the different processing elements 23 to be multiplexed or shared by the different controller elements 22 without there being any perceived processing delays. The clock frequency of the processing elements 23 should be at least n times faster than that applied to the individual controller elements, where n is equal to the number of controller elements 22. A controller element 22 can also control the configuration of the reconfigurable interconnect 21 enabling groups of processing elements to be concatenated to form different datapath functions.

Figure 7:
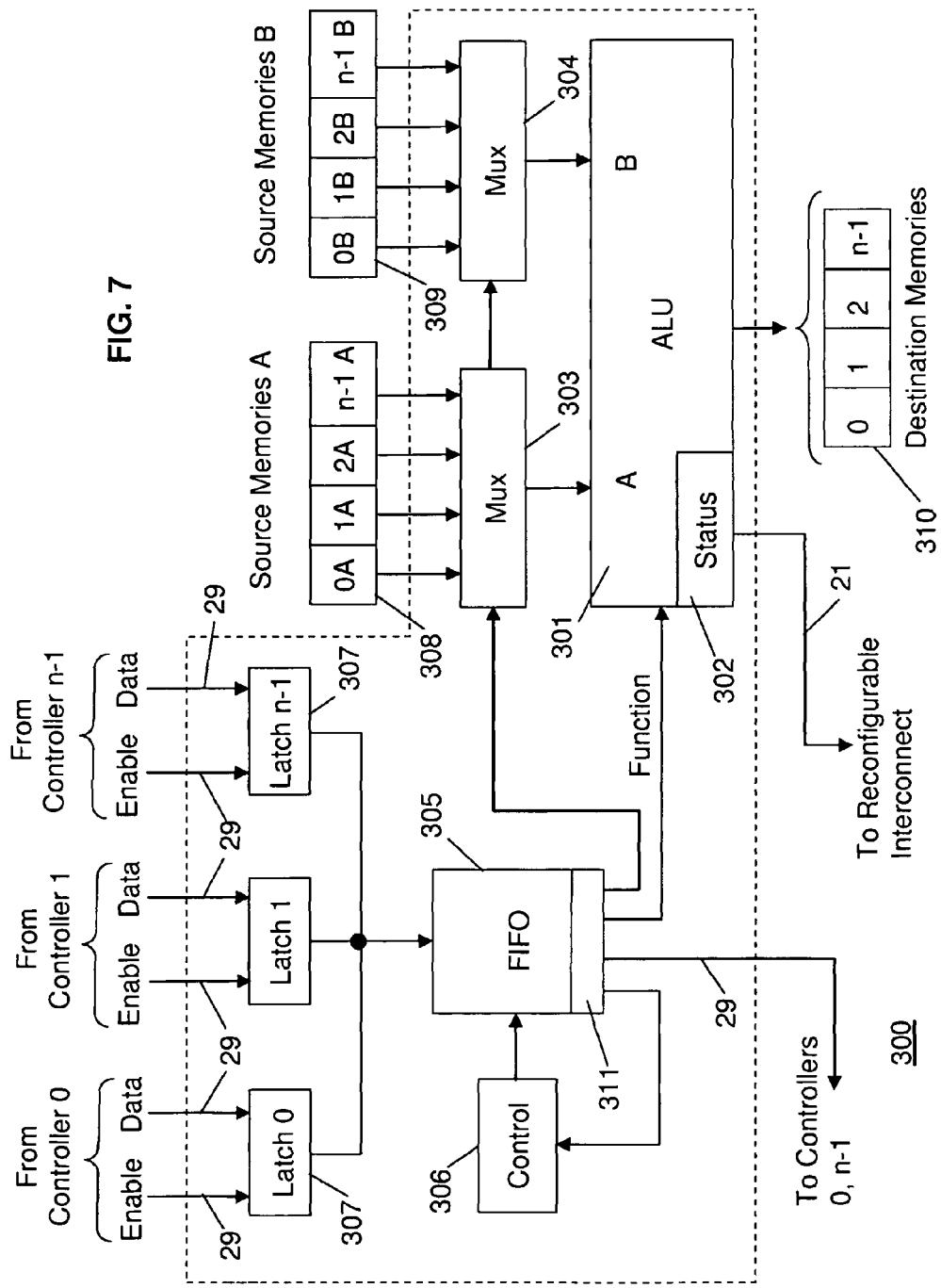
FIG. 7 shows a logical block diagram of a particular type of shared processing element.

FIG. 7 shows a particular implementation of a processing element 23 used in the shared processing block 20A. This particular function is an arithmetic-logic processing element 300. The arithmetic logic unit (ALU) 301 has two inputs A and B connected to multiplexers 303 and 304 respectively. Each de-multiplexer 303 and 304 has N−1 source memories connected to it, where N is the number of controller elements 22 in the same processing block 20A. FIG. 7 shows two distinct groups of source memories, source memories A 308, labelled 0A through (n−1)A, and source memories B 309, labelled 0B through (n−1)B. In a preferred embodiment of the invention, source memory A and source memory B work as a paired group based on a common multiplexer select index. However, different source A and source B memories can be used as inputs to the ALU 301. Data output from the ALU 301 can be transferred to one of a plurality of destination memories 310. Status information 302 generated as a result of each ALU 301 operation is output to the reconfigurable interconnect 21. This data can then be read by any of the n−1 controller elements 22.

Figure 8:
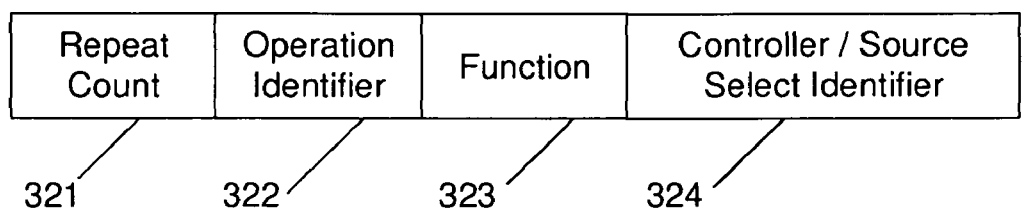
FIG. 8 shows the protocol format used by the processing element shown in FIG. 7.

Control of the ALU, source memory selection and destination memory selection is performed by signals output from the pipeline register 311. This register 320 is divided into several fields as shown in FIG. 8 with each field controlling a particular portion of the processing element 23. As outlined above, several controller elements 22 can share a group of common resources 23. To do so the processing elements need to operate at a higher frequency than the controller elements. In certain circumstances a controller will be operating at a lower frequency. For example, an input interface that receives data serially will convert it to a parallel format before processing and transferring the data internally. If the word length is 16-bits then a controller will wait 16 clock cycles before processing and transferring the data. Also, interfaces can employ flow control signals and so an interface may have to wait an integer number of clock cycles before new data is received. This therefore allows resources normally used by a controller to be shared by other controllers.

To access a processing element 23 each controller element 22 needs to make a request to that particular processing element. However, if only one controller element is used then the access circuitry is not required. In a preferred embodiment, as shown in FIG. 7, a register 307 is provided to store a request from each controller element 22. Each register 307 is connected to its corresponding controller element 22 via interconnections 29. Control unit 306 transfer each request word from registers 307 to the FIFO 305 on a round robin basis. If there is no request data for a particular controller then no data is transferred to the FIFO 305. If the FIFO 305 is empty as there are no requests then the associated circuitry, including the ALU, is not clocked (effectively turned off) to reduce power consumption. The control unit 306 transfers request data from the register 307 to the FIFO 305 at a frequency of at least N times the clock frequency used by the controller elements 22, where N is the number of controller elements 22 in a particular processing block 20A. The ALU, source memory read and destination memory write operations also operate at this higher frequency. If the FIFO 305 is not empty the control unit 306 reads the next FIFO location and transfers the stored request data to the pipeline register 311.

Field 324 of the request word is the Controller/Source Select Identifier. This field has several uses. It identifies the controller element 22 that made the request so result data can be returned to the appropriate source e.g. status information. In the preferred embodiment source memory A 308 and source memory B 309 are associated with each controller element 22. Therefore, field 324 can be used to select the source memory pairs. The function field 323 is used to select the desired ALU 301 function. Field 322 is the Operation Identifier. This effectively acts as a timestamp and can be used by the controller element 22 to synchronize the sequence of operations if several have been scheduled. This method of operation allows greater throughput and saves the controller element waiting for the return of each result from a processing element 23. It also allows the implantation of out of order processing or out of sequence processing where intermediate results can be calculated before all the data for implementing an algorithm or function becomes fully available. Field 321 is the Repeat Field. A controller element 22 may wish to perform the same operation on a sequence of data. Instead of making several separate requests, the controller can make one request, which is then repeated several times. The number of repeat operations is determined by the Repeat Field 321 and used by the control unit 306 to implement the repeat operations.

As outlined above the sharing of the processing elements 23 does not have to be on round robin basis. Other methods of sharing the processing elements 23 can be employed. These are referred to as statistical multiplexing of the shared resources. One method of statistically multiplexing the processing elements 23 is to use a weighted allocation, such as that described above using the repeat field 321. Another method (not shown) is to employ a request/grant scheme where shared resources are provided on a first-come first-served basis. An extension to this method is to use a priority based request/grant scheme. The type of scheme employed will depend on the system and algorithms being implemented. The amount of statistical multiplexing can be determined from simulation of a particular system prior to implementing it in a Reconfigurable Resource Core 10.

FIG. 8 showed a particular request word format 320 as applied to the ALU processing element 23. The processing elements 23 can implement different fixed functions. Consequently, the request word format 320 for these will be different to that shown in FIG. 8. For example, a processing element 23 may implement a multiplier. Therefore, there does not need to be a Function field 323 as it is implicit what the operation is.

Though FIG. 7 illustrates a simple ALU, a processing element 23 can be configured to implement a set of sub-functions, such as a multiply and accumulate function used for implementing digital filters, Fast Fourier Transforms, Inverse Fast Fourier Transforms, Discrete Cosine Transforms (DCTs), correlation and convolution functions for example.

In another preferred embodiment uniform rigid hardware processing elements 23 can be concatenated to form wider operand word widths. For example, two 8-bit ALUs can be concatenated to form a 16-bit ALU. The routing of data signals, such as carry-in and carry-out signals, required for the larger configuration being routed via the reconfigurable interconnect 21. In addition, dedicated routing can be used and selected using multiplexers (not shown). The two processing elements 23 being controlled by a single controller element 22.

Figure 9:
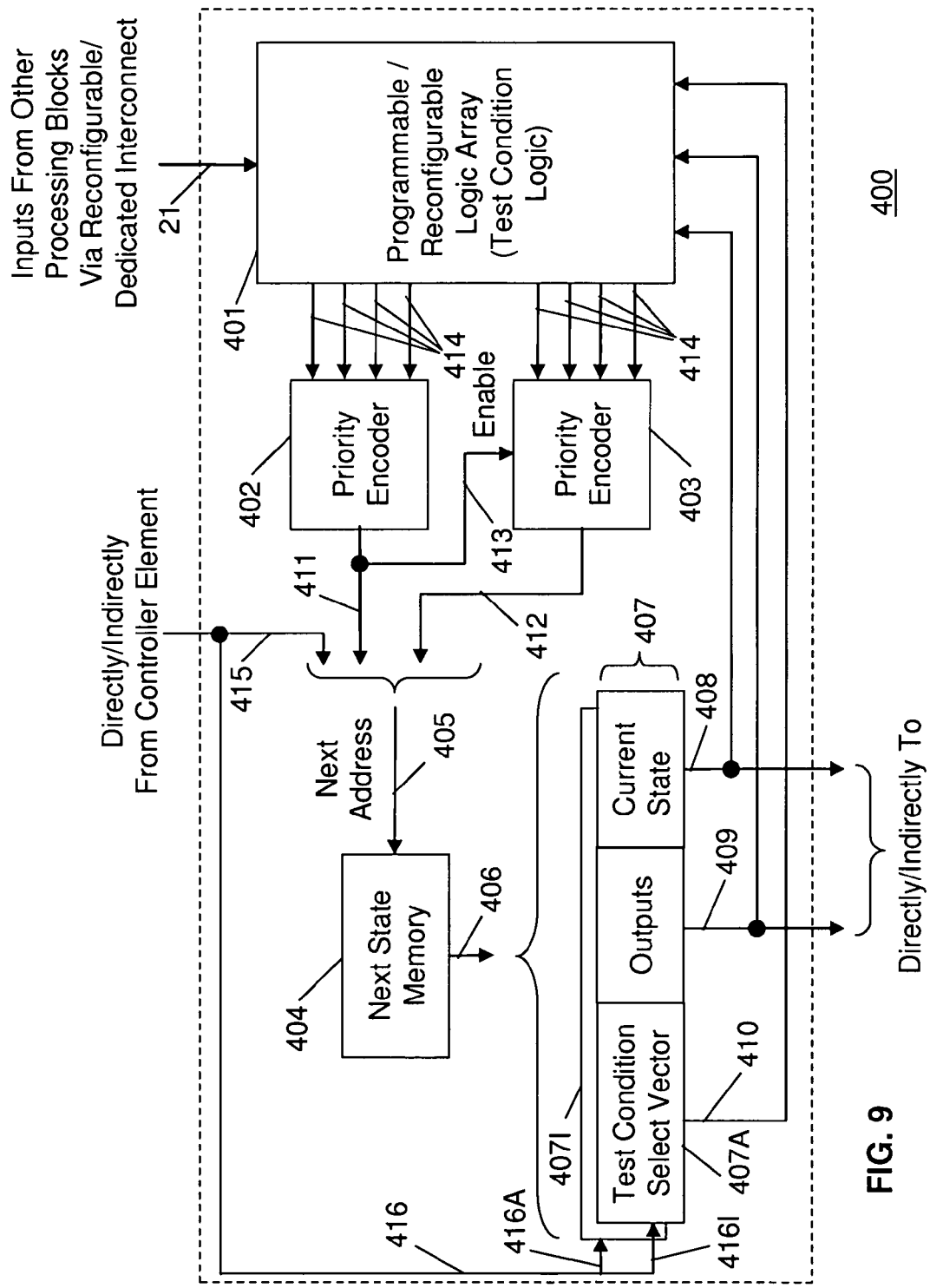
FIG. 9 shows a logical block diagram of a generic reconfigurable finite state machine.

FIG. 9 shows another implementation of a processing element 23. In this particular example the processing element implements a general-purpose reconfigurable finite state machine 400. However, the register portions can be bypassed so it can be used as a general-purpose combinatorial logic element. Data is input and output to the processing element 400 using reconfigurable interconnect 21. As described later, the selection of the input and output signals can be implemented using pass transistor and or multiplexers and de-multiplexers (not shown in FIG. 9). Reconfigurable Logic Array 401 is an array of programmable-rigid combinatorial logic gates, such as and gates, or gates, nand gates, nor gates, exclusive or gates and invertors, whose function is determined by the Test Condition Select Vector 410. In yet another embodiment of the invention the reconfigurable logic array 401 can employ multiplexers and or look-up tables to implement combinatorial logic functions.

Outputs 414 from the Reconfigurable Logic Array 401 are passed to the priority encoders 401 and 402. The output from priority encoder 401 forms part of the next address 405. It is also used to enable priority encoder 402. This architecture provides an efficient implementation for multi-level "if-then-else" routines used in C/C++, VHDL and Verilog languages. It also makes for easy finite state machine synthesis and design compilers. Though only one priority encoder 402 is shown more can be used for more complex combinatorial logic. Vectors 411 and 412 output from priority encoders 402 and 403 respectively are combined to form the Next Address vector 405. This is used as the address input to the next state memory 404. The output 406 from the next state memory 404 is stored on the next clock cycle in output register 407. The output register is divided into several separate fields. Field 408 represents the current state vector and is input to the Reconfigurable Logic Array 401. Field 409 provides output signals that are set depending on the current state.

To maximise logic utilization and sharing of resources the general purpose reconfigurable finite state machine 400 can be multiplexed in time to implement several finite state machines. In this configuration a controller element 22 is used to select and schedule the execution of each next state calculation for each finite state machine. The next state memory 404 contains the state vectors for each state of the different finite state machines. The various state vectors for a particular finite state machine are grouped together in memory. An address offset field 415 is provided by the controller element 22 to allow addressing of the different finite state machine groups in memory 404. Once calculated, the current state vector for each finite state machine is stored in an output register 407, shown as 407A through 407I in FIG. 9. Each current state output register 407 has an enable signal 416, shown as 416A through 416I, which is used by the controller element 22 to dynamically select and load the corresponding output register 407.

In another embodiment, the shared processing resource elements 23 can be multiple instances of the same function, such as a multiplier. This configuration is useful for parallel processing applications where the same operation is applied multiple times. This allows one controller element 22 to access and use many processing elements 23 simultaneously. The reconfigurable interconnect 21 also allows the output from one processing element 23 to be input to any other processing element 23. This allows many processing elements to be concatenated in different ways to form different combinatorial datapaths and hence algorithmic functions. The reconfiguring of the different processing element 23 concatenation configurations can be changed on a cycle-by-cycle basis under the control of either a reconfigurable interconnect controller 25 or controller element 22. As described later, when a controller element 22 is used to control the reconfigurable interconnect the control signals that are used to select the various inputs to each processing element 23 are taken from the pipeline register 530. In this configuration, the pipeline register 530 is taking on the role of the output register 252 and fields from the micro-code memory 520 are taking on the role of the connection memory 251. Fields from the micro-code memory 520 and corresponding fields in the pipeline register 530 would replace the connection memory 251 and output register 252 respectively.

This arrangement is shown in FIG. 19 and FIG. 23. FIG. 18 shows a section of pseudo code for implementing part of the AC3 exponent decoding function. FIG. 19 show the data flow graph for implementing this code in stage[i]. FIG. 21 shows a section of pseudo code for implementing subsequent part of the AC3 exponent decoding function once the previous function has completed. The FIG. 22 show the data flow graph for implementing this code in stage [i+1]. In stage[i] the reconfigurable interconnect 21 of a particular processing block 2 is configured so the various processing elements are concatenated to implement the data flow graph shown in FIG. 19. This configuration is shown in FIG. 20. The configuration can be implemented for many clock cycles using different input data at each clock cycle. Once stage[i] has completed the stage[i+1] configuration can be implemented by reconfiguring the reconfigurable interconnect 21. This is shown in FIG. 23. This allows the next set of functions to be implemented on the required input data. By concatenating or cascading various processing elements that have combinatorial datapaths, many functions can be performed in parallel and in one clock cycle. This concatenating or cascading of processing elements 23 then forms an overall datapath function. As there are many processing elements, different groups of processing elements 23 can be concatenated or cascaded by the same controller 22 allowing different datapath functions to be implemented in the same clock cycle. In addition, intermediate outputs from any processing element can be used as input to another group of concatenated processing elements if one or a plurality of processing groups share a particular function or result.

Figure 10:
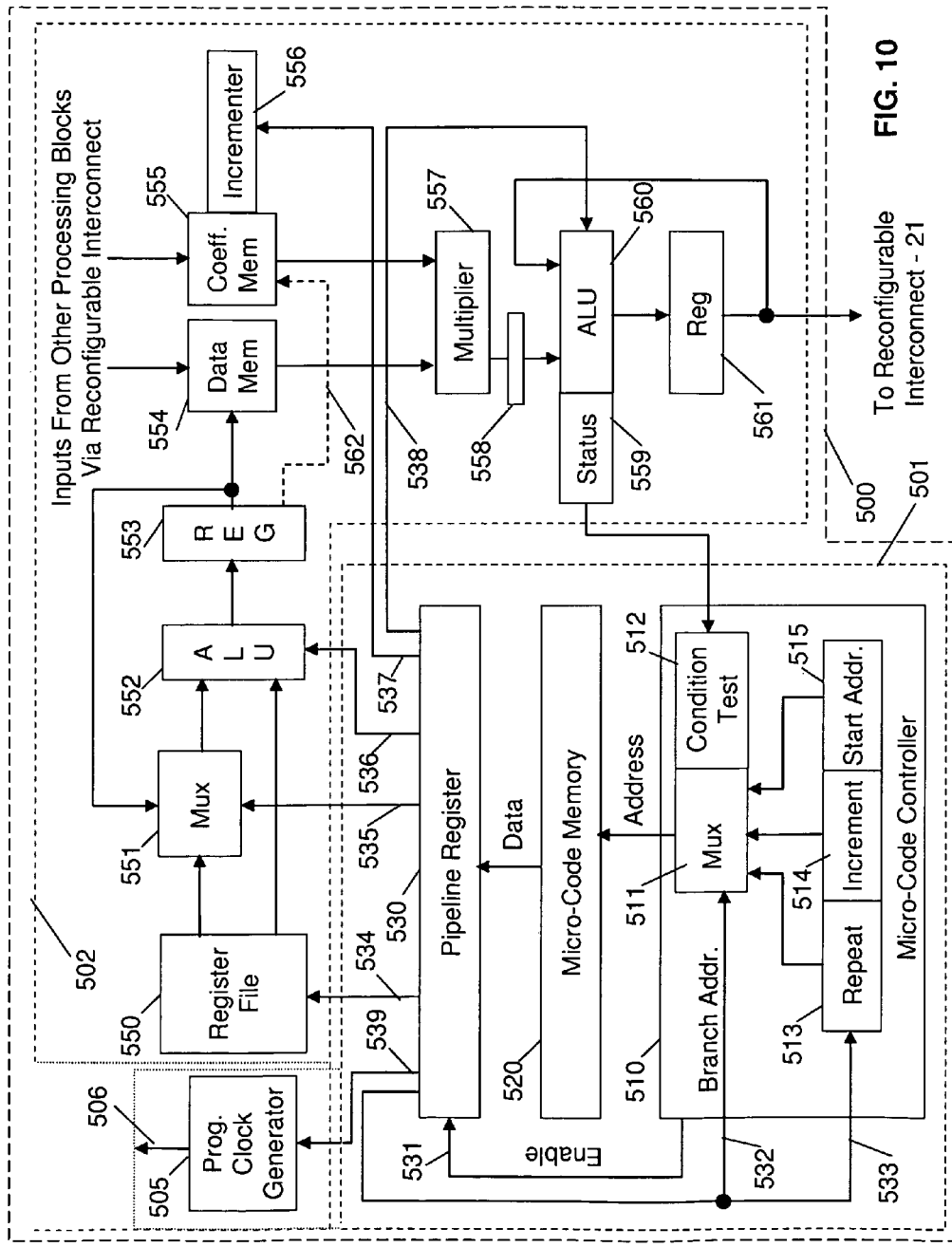
FIG. 10 shows a logical block diagram of a generic dedicated controller element and processing element.

A dedicated resource 26 comprises a controller element 22 and a processing element 24. The processing element 24 can implement one or a plurality of different algorithms or functions and can contain more than one rigid processing resource. FIG. 10 shows a logical block diagram of a particular form of dedicated resource 26 configured as a MAC processor 500. In this particular configuration the controller element 22 is shown as a specific controller element 501 and the processing element 24 as a specific processing element 502. The controller element 501 is a programmable-rigid hard-wired resource. It is a micro-coded controller. Micro-code instructions used to implement and perform functions, sub-functions and algorithms are stored in the micro-code memory 520. The address of the next microinstruction is generated by the micro-code controller 510. The output from the micro-code memory 520 is stored in the pipeline register 530 on the next clock cycle if the enable signal 531 is valid. The output of the pipeline register 530 in divided into fields, each of which is used to control circuitry in both the micro-code controller 510 and the processing element 502. Controller elements 22 can have different micro-code sized memories 520 and corresponding pipeline register 530 depend on the type of control, number of processing elements 23 and reconfigurable interconnect buses 21 that are required in each processing block 2. A programmable clock generator 505 is used to supply various clock signals to the different logic blocks within a processing block 2. The programmable clock generator 505 is effectively a clock divider whose input reference clock is the system clock labelled MK in FIGS. 11*a*, 11*b* and 11*c*. This clock is also available as an programmable clock output 506. In general, one programmable clock generator 505 is associated with one processing block 2.

Figure 11A:
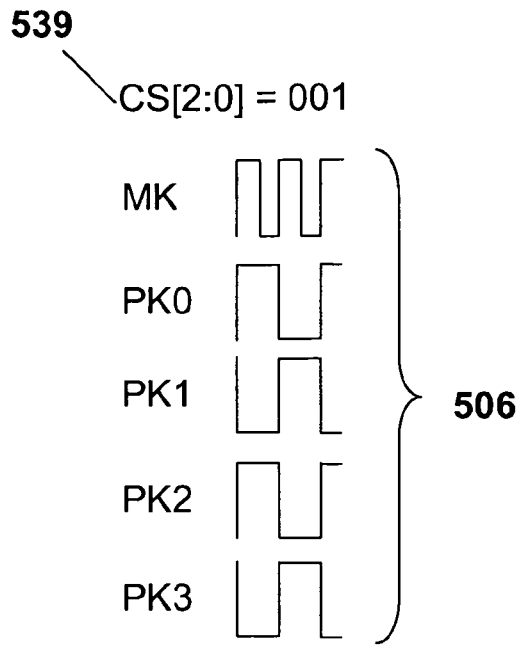
FIGS. 11a, 11b and 11c show examples of clock waveforms generated by the programmable clock generator.
Figure 11B:
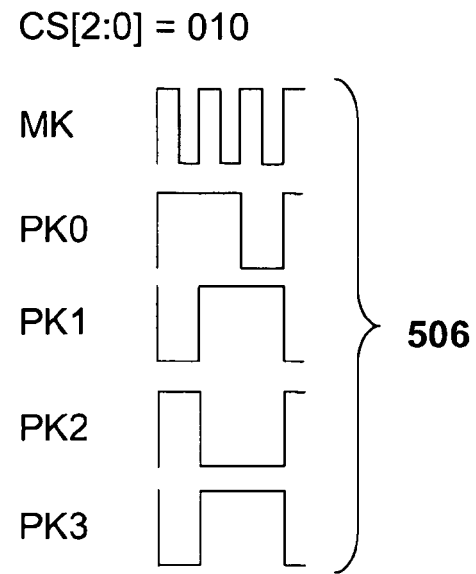
Figure 11C:
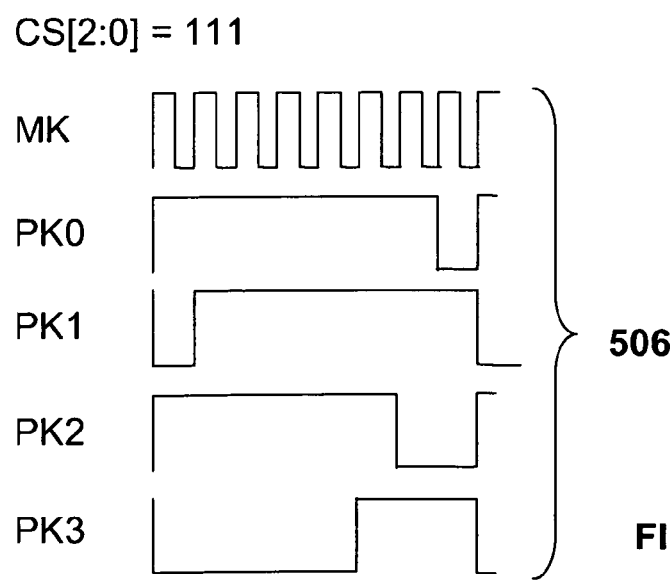

The programmable clock generator 505 outputs one or a plurality of clock signals 506. The duty cycle and clock frequency of the programmable clocks 506 can vary on a clock cycle by clock cycle basis. The selection of the desired clock frequency is determined by the programmable clock frequency field 539, which is output from the pipeline register 530. The programmable clock frequency field is labelled CS[2:0] (Clock Select[2:0]) in FIGS. 11*a*, 11*b* and 11*c*. In this particular example, the field is 3-bits wide CS[2:0] to allow one of eight different clock frequencies to be chosen during any clock cycle. However, there is no reason why the programmable clock frequency field 539 can not have more or less bits and is dependent on the number clock frequencies required for a particular application. Examples of the different programmable clock generator outputs 506 are shown in FIGS. 11*a*, 11*b* and 11*c*. Though FIGS. 11*a*, 11*b* and 11*c* show specific programmable clock waveforms, other programmable clock waveforms 506 can be generated by the programmable clock generator 505. For a selected clock frequency all the output clocks 506 have the same clock frequency, but can have different waveforms, as shown FIG. 11*c*, where the clock outputs PK0, PK1, PK2 and PK3 (collectively 506) have different waveforms. In addition, the programmable clock outputs PK0, PK1, PK2 and PK3 can be disabled in order to reduce power consumption when certain processing elements are not being used.

The system clock used to drive the programmable clock generator (not shown) and from which all divided output clocks 506 are derived is such a frequency that any reconfigurable logic operation will be performed correctly and in the required time event to enable the corresponding application for which the Reconfigurable Resource Core 10 is employed to operate correctly and minimize and signal distortion and noise.

One reason for employing the programmable clock generator 505 is that the number of processing elements 23 that are cascaded to form a datapath and implement a specific set of functions can vary on clock cycle by clock cycle basis. Consequently, the clock frequency will therefore need to be proportional to the number of cascaded processing elements to cater for the varying path delays. This technique allows Reconfigurable Resource Core 10 to operate at an optimal clock frequency based on the processing requirements. Fixed clock architectures mean that the maximum clock frequency is based on the worst case path delays. In order to increase the throughput in latter approach, the clock frequency is increased, but this means that extra pipeline register stages are required to hold the intermediate data. As a result, more registers or available reconfigurable resources are used. This then increases the area, power consumption and is less flexible as the available reconfigurable resources are used for storage. By concatenating processing elements and running the clock frequency at the required rate means that there is no need for the extra intermediate pipeline registers in the datapath. Another advantage of employing the programmable clock generator is that it allows the Reconfigurable Resource Core to be employed in different applications requiring different system clocks. It almost means that when the processing requirements are low, the selected clock frequency will be low. This then contributes to reducing the overall power consumption.

When several controllers 22 are used with the same group of processing elements 23 (processing block 2), then only one programmable clock generator is used. This is accessed by the other controllers (not shown) and the selected clock frequency is that for the longest cascaded datapath formed by cascading a group of processing elements 23. The allocation of a programmable clock generator to a micro-code controller 510 can be decided at design time by the circuit designer.

The micro-code memory 520 can store a sequence of microinstructions to perform one task or function or several groups of microinstructions used to implement several tasks or sub-functions. Different fields within a microinstruction can be used to control the processing element functions, the reconfigurable interconnect, micro-code controller 510 and input-output functions. The contents of a micro-code memory 520 can be changed dynamically either in real-time or non real time by a master controller 16 on a clock cycle by clock cycle basis. This technique allows dynamic sharing of the available resources and gives more efficient logic utilization. Consequently, the same controller element 22 can implement and perform many different algorithmic functions. Depending of the overall system functionality, different micro-code memory 520 used in each controller element 22 can be dynamically reconfigured at different rates. For example, controller elements 22 used to implement input and output interfaces only need to be configured at system initialisation or system reset. These types of functions don't normally change during device operation. Alternatively, the micro-code memory 520 can be loaded many times per second with a new sequence of microinstructions so the associated controller element 22 can implement many different functions. This method allows the same rigid hardware elements to be reconfigured in real time and non real time. Consequently, the same reconfigurable integrated circuit can be used in many different applications, such as audio, video, data processing and telecommunication protocol processing. It also allows an application employing a reconfigurable integrated circuit to implement new standards, upgrades and new applications. Hence, bringing an end to built-in obsolescence. The output from a pipeline register 530 can be routed to several processing elements 23,24 having the same function. This then provides means for implementing a Single Instruction Multiple Data (SIMD) type architecture. Having different controller elements 22 controlling different processing elements 23,24 provides means for implementing Multiple Instruction Multiple Data (MIMD) type architecture.

In addition, a controller element and a group of processing elements 23 can be reconfigured on a clock cycle by clock cycle basis to implement and effectively emulate the instruction sets of other microprocessors, RISC processors, microcontrollers or high level language constructs, such as those of the ANSI C language. This latter approach would allow the direct implementation of a C language processor. Being able to emulate other microprocessor or RISC processor instruction sets enables the same reconfigurable device to target a diverse range of applications, which employ different microprocessors or RISC cores.

The next micro-code memory address is selected from one of several sources. The selected address is output via the multiplexer 511. The source of the next microinstruction address is based on the current microinstruction being processed and test conditions. The microinstruction is provided by a field output from the pipeline register 530. The micro-code controller 510 has its own instruction set, which are used to select the source of the next microinstruction. Internal micro-code controller signals are also used to decrement internal counters and control the internal stack (not shown). The micro-code controller instructions include operations, such as continue to next sequential microinstruction address, conditional and non-conditional jumps, push to stack, pop from stack, looping instructions, multi-way branches, set interrupt mask register, clear interrupt mask bits. At reset or initialisation the start address register 515 is selected. For sequential microinstructions the source of the next address is from the incrementer 514 which increments the current address by 1 each clock cycle. The micro-code controller can jump to a non-contiguous address in the micro-code memory 520 by selecting the branch address 532 output from the pipeline register 530. The decision to perform the branch instruction can be conditional or non-conditional. For conditional branches the micro-code controller 510 tests a selected condition using the condition test logic 512. The inputs to the condition test logic 512 come for the ALU status logic 559 in this particular example. The micro-code controller 510 can also perform vectored interrupts and uses a stack (not shown) to maintain address pointers. This is another source of branch address. The return address being poped from the stack during a return from subroutine or pop stack microinstruction. For some algorithms the same instruction needs to be repeated a number of times. To achieve this a repeat count register 513 is used. This register is loaded with a repeat value 533 from the pipeline register 530. To reduce the width of the pipeline register it is possible to multiplex the repeat field 533 and branch address 532 outputs. When a microinstruction is being repeated the pipeline register 530 is inhibited from being clocked by the enable signal 531.

As outlined above, the micro-code controller 510 performs a particular operation by decoding the micro-code controller instruction code, which forms part of the whole microinstruction. As a user can create their own microinstruction form and allocate different fields to control different control and processing element function they can effectively create their own instruction set. Though the micro-code controller can perform a diverse range of operations to select the source of the address of the next microinstruction, there may be occasions when a user would want to create and implement their own micro-code controller operations or instructions. In a preferred embodiment of the invention, micro-code controller internal control signals can be brought out and connected to the output of the pipeline register 530. This then by passes the micro-code controller operation/instruction decoder (not shown) and allows the user to implement their own micro-code controller 510 instructions. The processing element 502 in FIG. 10 implements a multiply-accumulate function.

This can be used for implementing digital filters, Fast Fourier transforms, Inverse Fast Fourier Transforms (IFFTs), discrete cosine transforms, periodic and non-periodic waveform generation, correlation and convolution functions for example. Apart from the memories used in 502 the other circuitry can be hardwired. The multiplier 557 can perform fixed and or floating-point calculations. It takes its inputs form a data memory 554 and a coefficient memory 555. The coefficient memory 555 has a dedicated incrementer 556, which is incremented every clock cycle under the control pipeline register 530. The inputs to the data memory 554 and coefficient memory 555 are via the reconfigurable interconnect 21. Output data is also transferred to other processing resources via the reconfigurable interconnect 21. The output of the multiplier 557 can be latched using register 558. The output of the register 558 is input to the ALU 560 together with the output of the register 561. Though only one ALU output register 561 is shown, several can be provided and selectively input to the ALU 560. Selection of the ALU function is determined by the pipeline register field 538.

The data memory 554 address is generated using dedicated logic. Similar logic can also be used to address the coefficient memory 555 and is indicated in FIG. 10 by signals 562. As several algorithms my be being used, a register file 550 is provided to hold the start addresses for each set of data. The register file 550 location address is provided by the pipeline register field 534. The data memory address is stored in register 553 and is calculated by the address ALU 552. The inputs to the address ALU 552 come from the register file 550 and the multiplexer 551. Address ALU function and data input selection are determined by the pipeline register fields 536 and 535 respectively.

As the pipeline register 530 controls several circuit blocks many processing actions can be performed in parallel and a greater throughput can be achieved (hardware acceleration). In another embodiment, the dedicated processing resource elements 502 can be multiple instances of the same function, such as a multiplier. This configuration is useful for parallel processing applications where the same operation is applied multiple times. This allows one controller element 501 to access and use many processing elements 502 simultaneously.

Many of the basic processing elements 23 implement many basic logic and or arithmetic operations and so can be applied to many applications. This approach maximizes their use and reconfigurability. For example, several processing elements could be combined to form floating point processing elements allowing a device based on this technology to implement both fixed point and floating point functions.

Figure 12:
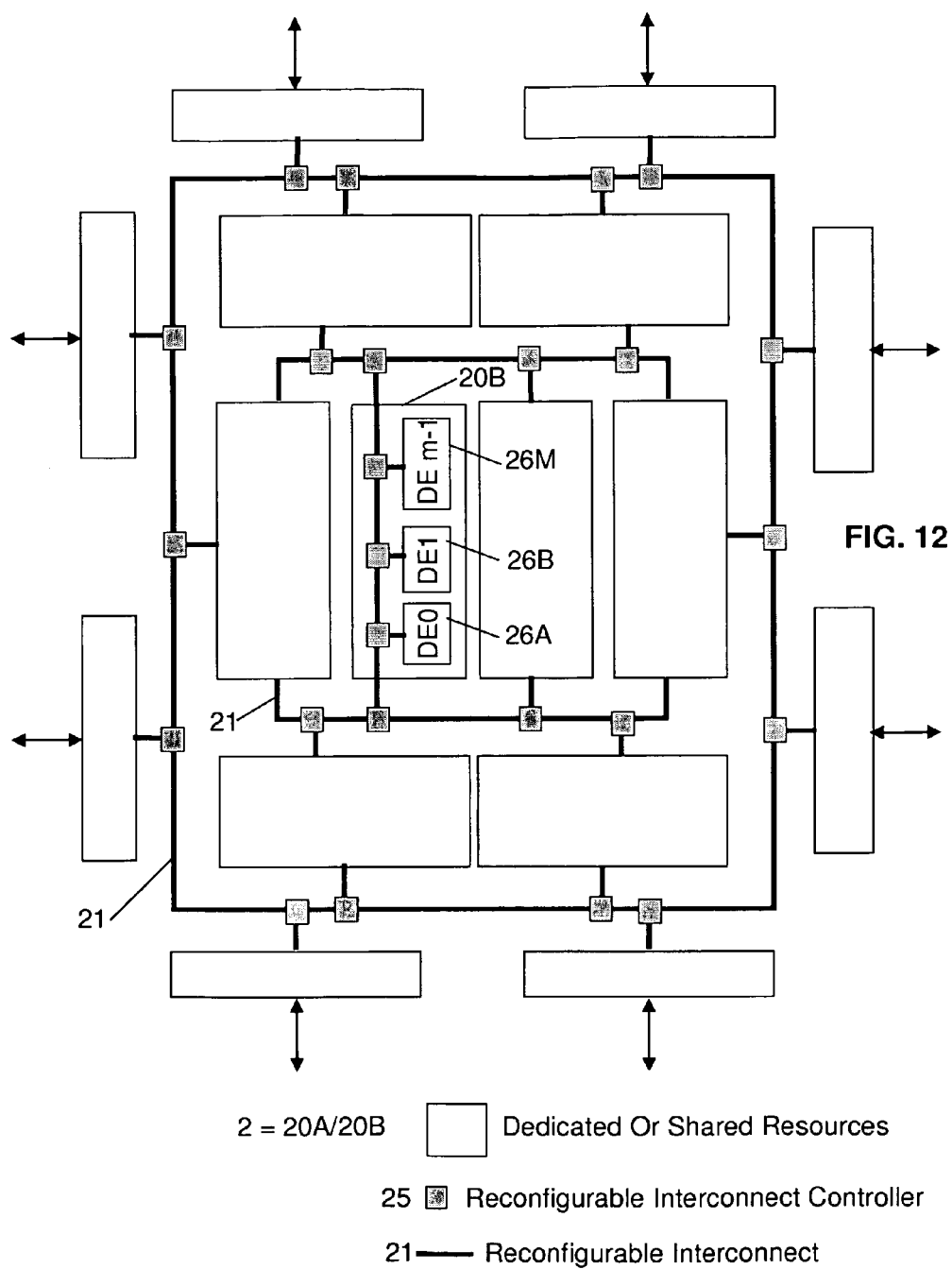
FIG. 12 shows a logical block diagram for interconnecting different processing blocks in a hierarchical fashion.

The processing blocks 2 may be grouped and interconnected in different ways to form different device architectures. Both shared resource processing blocks 20A and dedicated resource processing blocks 20B may be freely mixed and replicated to form architectures consisting of 10 s, 100 s or 1000 s of blocks. FIG. 12 shows how both shared resource processing blocks 20A and dedicated resource processing blocks 20B may combined to form a hierarchical network of processing blocks. These processing blocks 2 communicate via the reconfigurable interconnect 21. The actual routing of signals between the processing blocks is controlled by the reconfigurable interconnect controllers 25. In the hierarchical architecture the outer processing blocks 2 will tend to be the shared resource processing blocks 20A and used to implement interface functions, for example. Whereas the inner processing blocks 2 will tend to be the dedicated resource processing blocks 20B used to perform processor intensive calculations.

Figure 13:
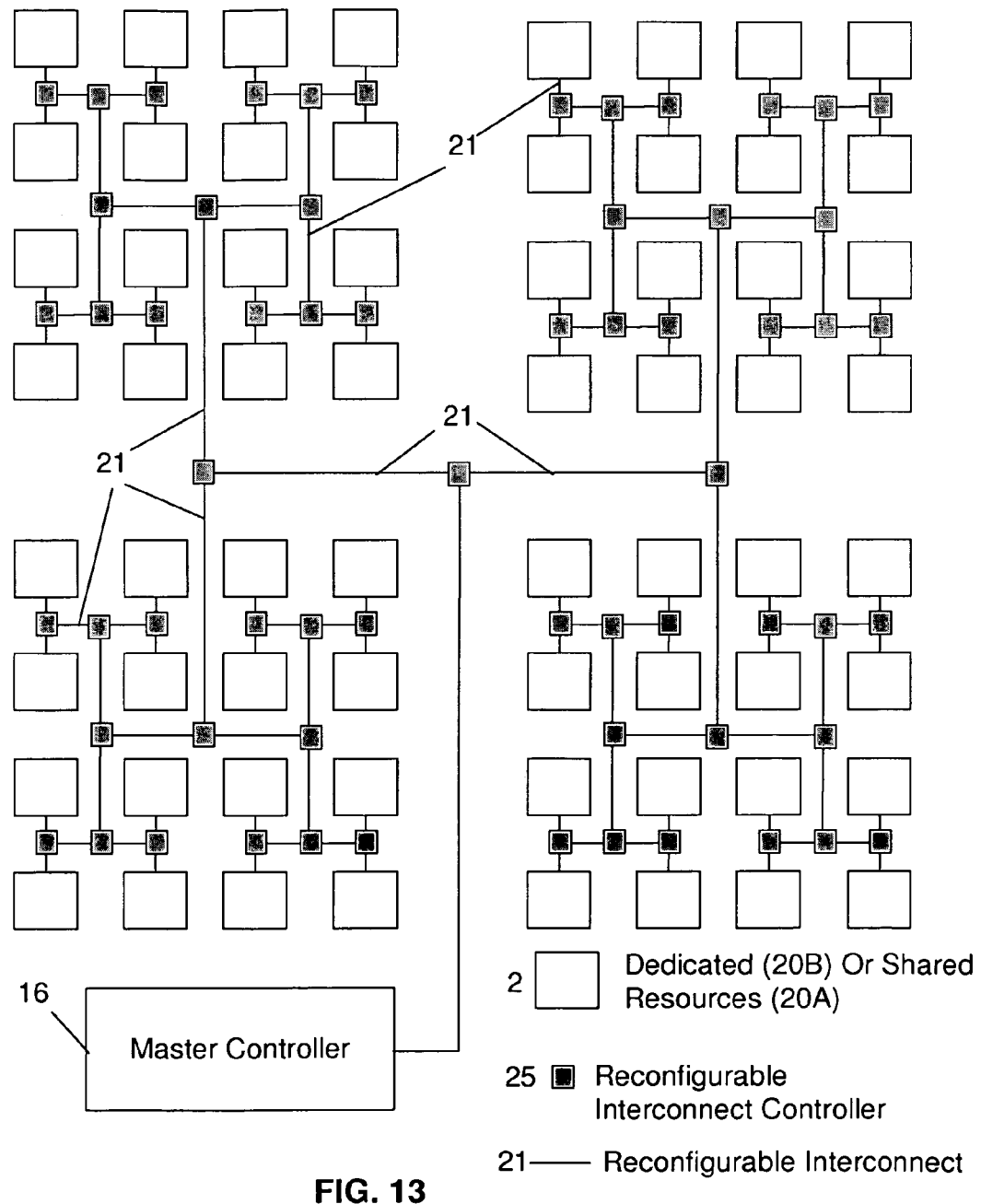
FIG. 13 shows a logical block diagram for interconnecting different processing blocks in a fractal fashion.

In another embodiment, the processing blocks 2 may be grouped as four units, for example, having local reconfigurable interconnect 21 and a reconfigurable interconnect controller 25. This sub-group can then be replicated many times to form a fractal type architecture as shown in FIG. 13.

The master controller 16 initialises the reconfigurable integrated circuit at start-up or reset. It has access to each of the reconfigurable interconnect memories 251 and micro-code memories 520 of each of the controller elements 23. Communication between the master controller and memories is via the reconfigurable interconnect 21. In a preferred embodiment, the communication between the master controller and memories 251, 520 is via a dedicated system bus 28. Configuration data used to implement different algorithmic functions and configure the routing between elements can be stored locally in the global memory 15. It can also be stored in external memory (not shown) and transferred to the selected internal configuration memories 251,520 by the master controller 16. Data my be written to a reconfigurable memory and read from a reconfigurable memory by the master controller 16. The updating of the interconnect memories 251 and micro-code memories 520 can be performed in both real time and non real time. Reconfiguring of these blocks by the master controller 16 means the contents of the memories associated with these blocks are updated with new configuration and program data. The configuring and reconfiguring of the processing blocks 2, the micro-code memory 520 of each controller element 22 and reconfigurable interconnect 21 by the master controller 16 can be performed in both real time and non real time. In real time mode, the updating on the configuration memories, for example the micro-code memory 520, is performed during device operation and at a rate that enables the selected algorithms to be implemented correctly to process the required data in the desired time event without causing any data corruption, timing errors or distortion to any input or output data. In an embodiment of the invention, the micro-code memory 520 can be double buffered (not shown) enabling the master controller to 16 to update the micro-code memory 520 while it is also being accessed by the micro-code controller 510. When a micro-code controller 510 finishes implementing the functions specified in the current configuration data or sub-program contained in the micro-code memory 520, the micro-code controller 510 issues an interrupt and or sends a control message to the master controller 16 requesting that the next configuration data or sub-program be loading into its micro-code memory 520. The same also applies for the Reconfigurable Interconnect Controllers 25.

Figure 14:
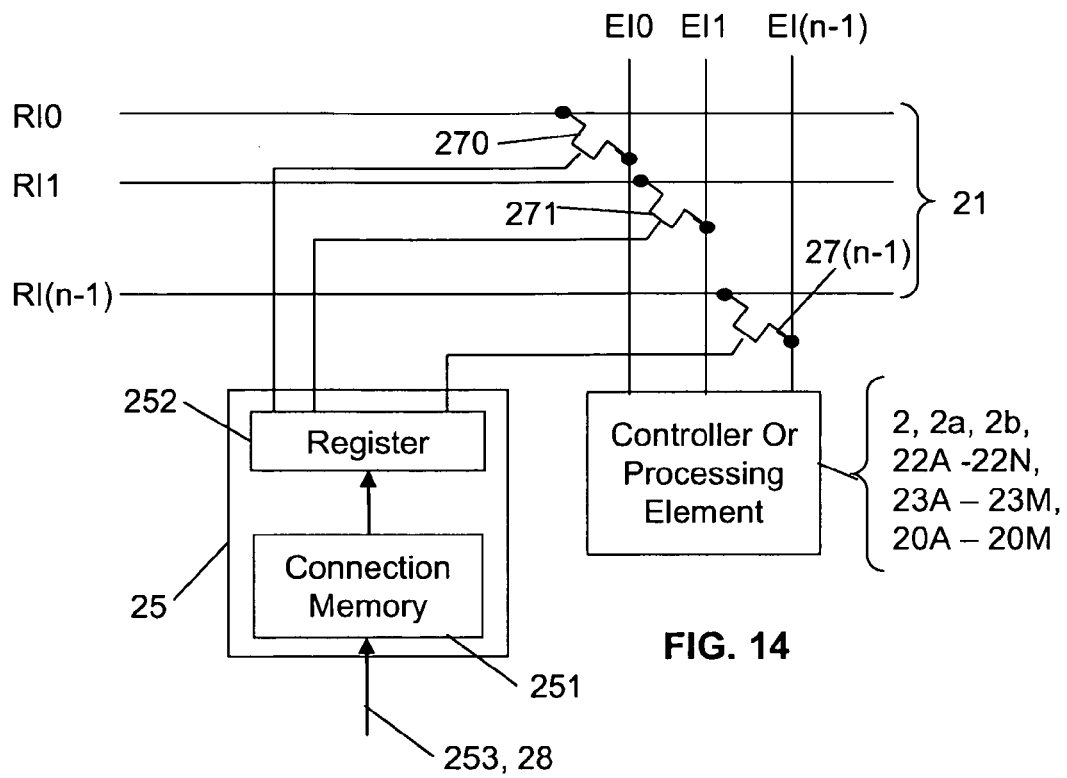
FIG. 14 details a particular method of implementing the reconfigurable interconnect.

There are different ways to implement the reconfigurable interconnect 21 and route signals to different processing blocks 2, elements 22/23/24, global memory 15 and the master controller 16. FIG. 14 outlines one method. The individual signal line RI0 through RIn−1 of the reconfigurable interconnect 21 can be connected to the individual signal lines EI0 through EIn−1 of a controller or processing element 2, 20A, 20B, 22A-22N, 23A-23M, 26A-26M using pass transistors 270 through 27($n$−1). Each pass transistor's gate is connected to a bit register 252 in a reconfigurable interconnect controller 25. Each input signal and output signal from either a controller element 22 or processing element 23 can be connected to one or more of the reconfigurable signals RI0 through RIn−1 (not shown). In addition, each input signal or output signal from either a controller element 22 or processing element 23 can be hardwired to the reconfigurable signals RI0 through RIn−1 (not shown) to reduce circuitry. In another embodiment a group of pass transistor's gates can be controlled by a single bit from the output register 252. Different routing configurations can be selected and are stored in the connection memory 251. By addressing different memory locations in the connection memory 251 and loading the output register 252 with different routing configuration data, different signal routing can be changed in real time (for example, on a cycle-by-cycle basis). The updating and accessing of the connection memory 251 is performed by either the master controller 16 via the dedicated interconnect 28 or can be performed locally by a controller element 23 via reconfigurable interconnect means 21 or dedicated connection means 253 and 253$a$.

As outlined above, in a preferred embodiment (not shown) the control of the pass transistor's gates, which control the reconfigurable, interconnect 21 can be controlled locally from the output of a controller element 22. In essence the reconfigurable interconnect controller is integrated into a controller element 22. When a controller element 22 is used to control the reconfigurable interconnect the control signals that are used to select the various inputs to each processing element 23 are taken from the pipeline register 530. In this configuration, the pipeline register 530 is taking on the role of the output register 252 and fields from the micro-code memory 520 are taking on the role of the connection memory 251. Fields from the micro-code memory 520 and corresponding fields in the pipeline register 530 would replace the connection memory 251 and output register 252 respectively. The fields of the micro-code memory 520 and pipeline register 530 effectively replacing the connection memory 252 and output register 251 used in the interconnect controller 25.

Figure 15:
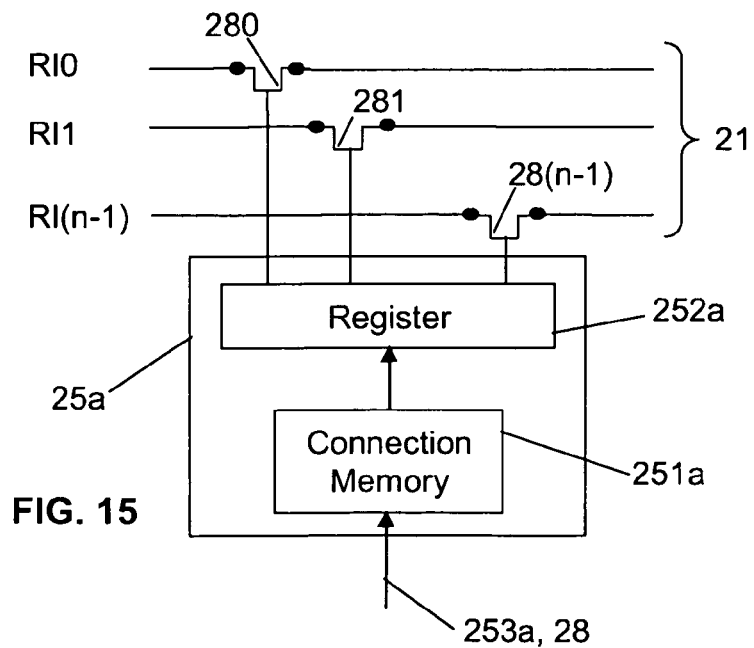
FIG. 15 details a particular method of isolating reconfigurable interconnect.

Pass transistors can also be used to isolate signals to a particular group of processing blocks or elements. FIG. 15 shows such a scheme. Individual signal lines RI0 through Rin−1 of the reconfigurable interconnect 21 have a pass transistor 280 through 28($n$−1) in series with each signal line respectively. The gates of the pass transistor 280 through 28($n$−1) are connected to individual bits of the register 252$a$ of a reconfigurable interconnect controller 25$a$. Different routing configurations can be selected and are stored in the connection memory 251$a$. By addressing the connection memory signal routing can be changed in real time. The updating of the connection memory 251 is performed by either the master controller 16 via the dedicated interconnect 28 or can be performed locally by a controller element 23 via reconfigurable interconnect means 21 or dedicated connection means 253 and 253$a$.

In addition to employing pass transistors for routing of signals, a processing block 2, controller element 22, processing element 23,24 and reconfigurable interconnect controller 25 can contain multiplexer elements which are used to select one signal from a group of input signals. In another embodiment of the invention, multiplexers 239 are used to route one of a group of selected reconfigurable interconnect buses to an input of a processing element 23, 24 or controller element 22. The multiplexer 239 then has a plurality of inputs taken from the reconfigurable interconnect 21, there being a reconfigurable interconnect bus for each processing element 23 used in a processing block 2. The reconfigurable interconnect 21 being formed from at least the processing element output buses. The reconfigurable interconnect 21 can also include individual status signals output from a processing element 23. A processing element's output bus being formed from the concatenation of a group of consecutive individual signal lines of the reconfigurable interconnect 21. The multiplexer 239 output selection 238 being controlled directly from control fields in the pipeline register 530. Likewise, signals may be output to the reconfigurable interconnection 21 and dedicated interconnect 28,29 using de-multiplexers. These routing methods are illustrated in FIG. 5 for both a controller element 22 and a processing element 23. Specific examples are shown for controller element 22B and processing element 23B. A group of input reconfigurable interconnect signals 21A are connected to multiplexer 220. Any of the input signals 21A can be routed to input signal 222 by applying the appropriated select code to the multiplexer select lines 224. Control of the multiplexer select lines 224 coming from either a controller element's pipeline register 530 or a reconfigurable interconnect controller's output register 252. A controller element output signal 223 can be multiplexed onto one of a group of output reconfigurable signals 21B using a demultiplexer 221. Control of the multiplexer select lines 225 coming from either a controller element's pipeline register 530 or a reconfigurable interconnect controller's output register 252.

The normal design flow when designing an ASIC type device would be to describe the various digital circuit elements in a hardware description language, such as Verilog, VHDL, SystemC or a proprietary description language. Once the design had been simulated and tested it would be synthesized in the target technology. However, as many of the processing elements 23 can be concatenated in different ways to form a combinatorial datapath, "false combinatorial paths" can be formed. These are paths separate to the desired combinatorial path and occur for example when an output is routed back to a previous used intermediate processing element. Potential problems occur when there are combinational paths through the processing elements and these processing elements are connected together. If it is possible to form a loop through the processing elements with settings of the reconfigurable interconnect and processing element input controls then this will be seen by synthesis tools and reported as a problem. Furthermore the synthesis tools will calculate worst case timings through these combinatorial loops resulting in poorer performance of the design. These "false combinatorial loops" are not meant to be enabled by any valid setting of micro-code controller pipeline register 530 bits so logic is added to identify the settings that would enable a loop and then assert an extra control to break the loop. The main advantage of including this capability is that combinations of processing elements will be able to be connected so that a number of operations may be done in a single clock cycle. The programmable clock generator 505 will then become useful in that it will allow long combinational paths to be executed in longer clock periods.

Figure 15A:
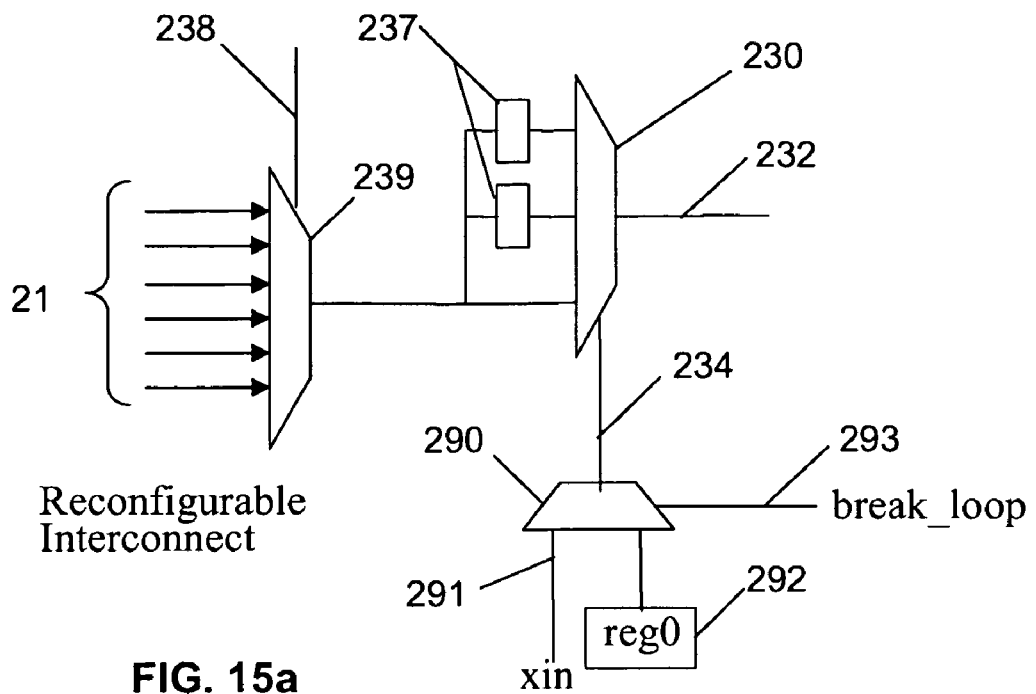
FIG. 15a show a processing element input multiplexer arrangement that can be used to break combinatorial loops.

A processing element 23 that has input registers 237 and an input select 234 to chose one register or a direct input can be augmented with a extra multiplexer 290 to facilitate loop breaking. The arrangement is shown in FIG. 15a. The xin control input 291 is passed through a 2-input multiplexer 290 whose other input is tied to a value that will select a register 292. The multiplexer select line is connect to a new processing element input 293 and called "break-loop". If there is a loop that includes a given processing element with this arrangement then a decoder can be added to detect the control values necessary to cause the loop to be completed and its output is connected to "break_loop" input. It is possible to minimise the number of loop breaking multiplexers by finding the processing elements that participate in the most loops. This is assuming there are more than one loop in a given processing block 2. Combinational loops can be found by searching or analysing the netlist structure using a suitable algorithm, such as finding circuits in a directed graph, as it is know. The algorithm need to find all loops and then find the minimum number of points to which a break needs to be added to break all loops.

The graph is formed from the processing block 2 description where each vertex represents a processing element 23 output or processing element 23 input and the edges represent possible connections. Only processing element 23 with combinational paths through them and only processing element 23 inputs that have a combinational path to an output are included in the graph. Because the reconfigurable interconnect selects which output an input connects to the direction of the edge is from one processing element 23 input via the reconfigurable interconnect to a processing element 23 output. Of course a processing element 23 input could connect to the output of the same processing element 23 and this situation represents the shortest possible loop. Control inputs will not be covered by this search. If a loop is formed in a design by connecting control inputs to some processing element 23 output they will not be found. This restriction is introduced to limit the complexity of the loop breaking logic. The algorithm works by maintaining three lists: the visited list, the global visited set and the loop list. The input to the algorithm consists of a list of processing element 23s which includes a list of outputs, inputs that have combinational paths to outputs. Each input has a list of processing element 23 outputs that they can connect to. All this data exists in the processing block 2 structural description.

The implementation is likely to involve recursion as the kernel of the algorithm involves pushing a processing element 23 onto the visited list and adding it to the global visited set. Then it proceeds by first by traversing the visited list from the start to check that the new vertex is not already there. If it is we have found a loop and it is added to the loop list by copying the list of processing element 23s and reconfigurable interconnect control settings that cause the loop. If no loop is found the recursion goes one step deeper if there is a path that is combinational. When all paths out of a processing element 23 are exhausted the recursion returns to the next level up. When the recursion reaches the top level, i.e. all paths starting at the first processing element 23 in the processing element 23 list have been searched, the next processing element 23 in the list not also in the global visited set is made the top level. This action (and the global visited set) ensures all possible loops are found even when the structure has islands, that is, there is more than one interconnected sets of processing element 23s.

The task of finding the minimum set of processing elements 23 that need to have a "break" control connected is achieved by finding which processing elements 23 take part in the most loops. This is done by traversing all processing elements 23 in the RPM and searching the loop list for each processing element 23 counting how many loops each processing element 23 appears in. Then, starting with the highest count mark the loops that the processing element 23 is in as "done" until the number of remaining loops is zero. The total number of loops is counted as they are found by the loop finding algorithm.

Once the set of loop breaking points has been found code can be added to the processing block 2 to implement the loop breaking logic. The idea is that a combinational loop cannot be created by any set of pipeline register values. Each loop equates to a set of control values and reconfigurable interconnect input select values. This forms a set of bits that need to be "ANDed" together. Bits that need to be zero are inverted. A single break point could break a number of loops so the output of the "AND" gates are "ORed" together to form the signal that is connected to the relevant loop breaking control input. The complexity of the extra logic is $O(\log(N)*N)$ where N is the number of processing elements 23. This assumes all processing elements 23 are connected to all others and all have combinational paths. Most real processing blocks will be less connected than this.

Adding the logic to the processing blocks does not stop the user from configuring the processing block in a sequence step such that the loop would be enabled. So it is necessary to check for such sequence statements. The loop list is included in the compiled processing block and each statement is checked to see if it is "bad". A warning message will be produced if a bad statement is found. It maybe the case that the user knows what they want to happen so only a warning is issued.

For a shared resource element, such as 23B, a group of input reconfigurable interconnect signals 21C are connected to multiplexer 230. Any of the input signals 21C can be routed to input signal 232 by applying the appropriated select code to the multiplexer select lines 234. Control of the multiplexer select lines 234 coming from a reconfigurable interconnect controller's output register 252. A processing element output signal 233 can be multiplexed onto one of a group of output reconfigurable signals 21D using a de-multiplexer 231. Control of the multiplexer select lines 235 coming from either a controller element's pipeline register 530 or a reconfigurable interconnect controller's output register 252.

Routing of input and output to and from a dedicated processing element 26 is illustrated in FIG. 6 with reference to dedicated processing element 26B. A group of input reconfigurable interconnect signals 21E are connected to multiplexer 260. Any of the input signals 21E can be routed to input signal 262 by applying the appropriated select code to the multiplexer select lines 264. Control of the multiplexer select lines 264 coming from either a controller element's pipeline register 530 or a reconfigurable interconnect controller's output register 252. A dedicated element output signal 263 can be multiplexed onto one of a group of output reconfigurable signals 21F using a de-multiplexer 261. Control of the multiplexer select lines 265, 267, 268 coming from either a controller element's pipeline register 530 or a reconfigurable interconnect controller's output register 252.

In another preferred embodiment, programmable-rigid hardwired resources are employed. One type of programmable-rigid hardwired resource is a reconfigurable multi-tap finite state machine 600.

Figure 16:
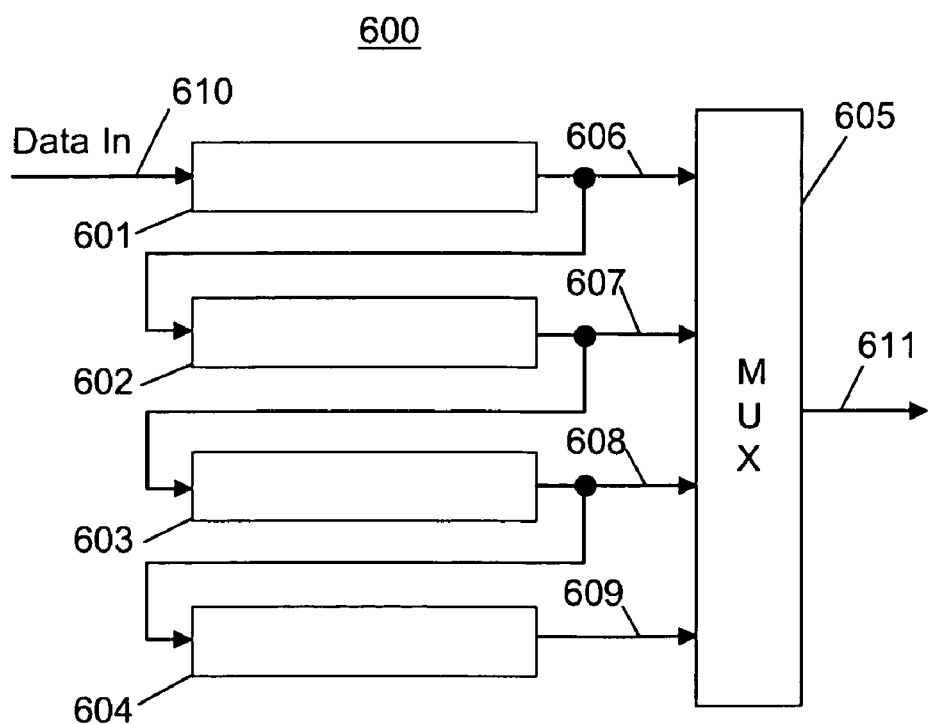
FIG. 16 shows a logical block diagram for implementing a programmable-rigid processing resource.

FIG. 16 shows how four smaller multi-tap finite state machines 601 through 603 can be connected to form a larger multi-tap finite state machine 600. The output of the previous smaller multi-tap finite state machine being connected to the input of the next smaller multi-tap finite state machine. For example, output signal 606 of smaller multi-tap finite state machine 601 is connected to the input of smaller multi-tap finite state machine 602. Multiplexer 605 is used to select the outputs 606 through 609 of the smaller multi-tap finite state machines 601 through 603 respectively. The selected serial data appearing on output 611.

Figure 17:
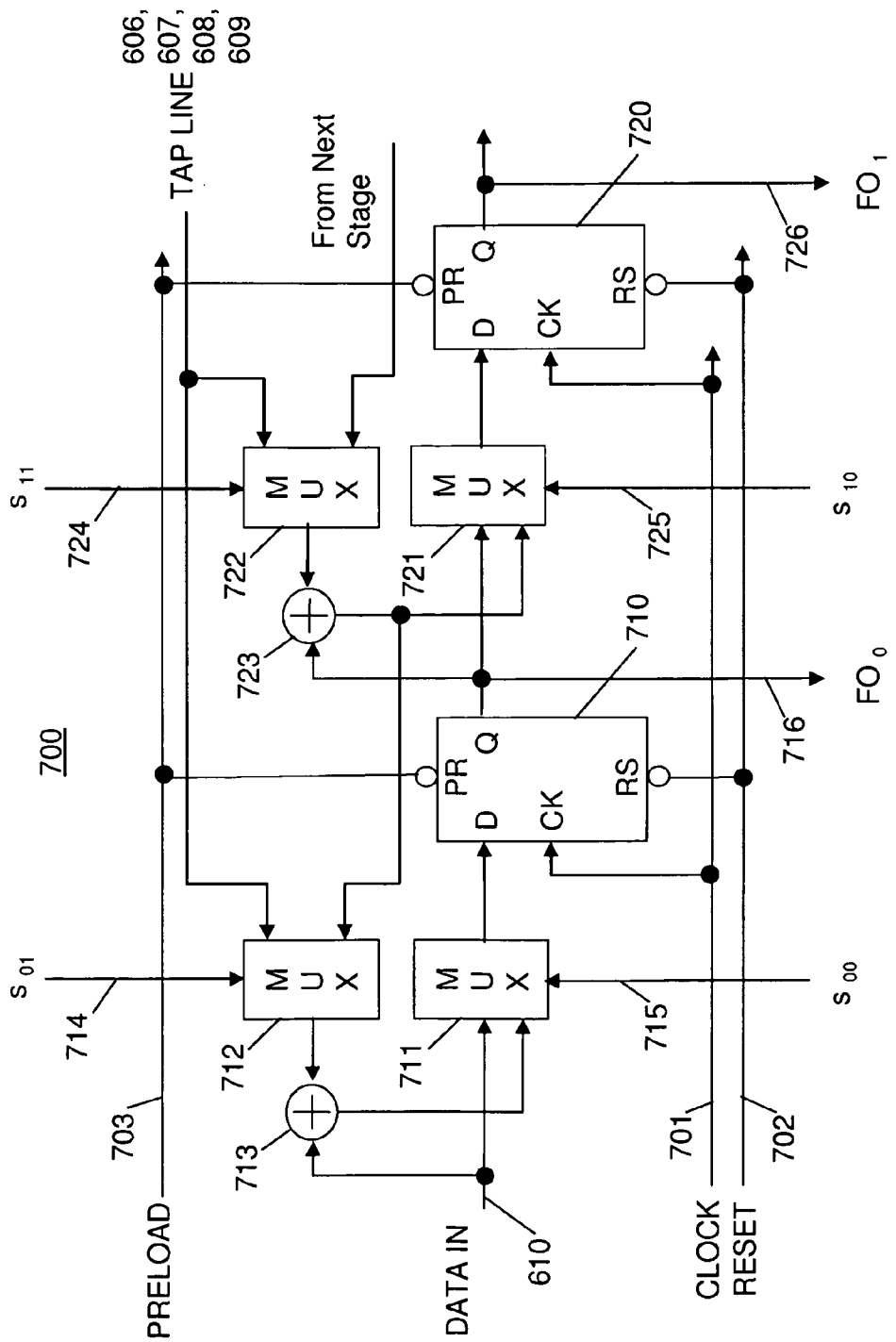
FIG. 17 shows in part a one section of a programmable-rigid serial finite state machine resource.

FIG. 17 shows the logic used to implement two stages of a smaller multi-tap finite state machine. Each bit stage includes a 1-bit register 710, 720 to store each input bit when clocked with clock signal 701. These registers can also be reset using the reset signal 702 or preloaded using signal 703. Multiplexer 712 is used to select either the tap line input 606, 607, 608 or 609 or the output form the next stage's exclusive or gate 721. Output selection is determined by the signal line 714 and can be driven from a controller element 22. The output of the multiplexer 712 is input to the exclusive or gate 713 of this stage of the smaller multi-tap finite state machine. The other input to the exclusive or gate 713 is the data input 610 as this is the first stage of the smaller multi-tap finite state machine. For each subsequent stage of the smaller multi-tap finite state machine the input to the exclusive or gate is the output from the previous stage. The output of the exclusive or gate of a particular stage is input into a multiplexer. For stage 0 the output from exclusive or gate 713 is input to multiplexer 711. The other input to the multiplexer is the output from the previous stage or the data in input 610 if it is the first stage. Output selection is determined by the signal line 715 and can be driven from a controller element 22. By controlling the outputs of the two multiplexers used in each stage of these reconfigurable resources can be used to implement a wide range of serial dividers, serial multipliers, Linear Feedback Shift Registers (LFSRs), Cyclic Redundancy Checkers (CRCs) and cyclic coders. This is particularly useful when implementing different interfaces and protocols.

In yet another preferred embodiment one or a plurality of controller elements 22 and processing elements 23,24 can be configured to implement test circuitry to check the operation of the various controller elements 22, processing elements 23, 24 and reconfigurable interconnection controllers 25. If any of the latter circuit elements are found to be operating incorrectly these fault conditions can be reported to a master controller 16 so they are not included in the implementation of live operational circuits.

Although the invention has been described herein with reference to particular preferred embodiments, it is to be understood that these embodiments are illustrative of the aspects of the invention. As such, a person skilled in the art may make numerous modifications to the illustrative embodiments described herein. Such modifications and other arrangements which may be devised to implement the invention should not be deemed as departing from the spirit and scope of the invention as described and claimed herein.

What is claimed is:

1. A reconfigurable integrated circuit comprising:
   one or a plurality of controller elements, the plurality of controller elements including a first controller element and a second controller element, the first controller element having a first controller element architecture and a second controller element having a second controller element architecture, the first architecture being different from the second architecture;
   a plurality of processing elements, which can be concatenated to form at least one combinatorial logic datapath;
   the plurality of controller elements and the plurality of processing elements being logically grouped into at least one processing block; and
   reconfigurable interconnection means, which can be configured by one or a plurality of controller elements, the reconfigurable interconnection means being dynamically reconfigurable in real time and non real time, the reconfigurable interconnection means allowing data transfers between processing elements and data transfers between processing elements and controller elements;
   wherein one or a plurality of controller elements and processing elements are optimized for emulating high level language instruction contructs, and
   wherein one or a plurality of controller elements and processing elements are optimized for emulating different processor instruction sets.

2. The reconfigurable integrated circuit of claim 1, wherein the first controller element architecture and the second controller element architecture are selected from a plurality of specific architectures, the plurality of architectures including rigid architectures and programmable-rigid architectures.

3. The reconfigurable integrated circuit of claim 2, wherein the rigid architectures and programmable-rigid architectures have different control fields and control field data widths.

4. The reconfigurable integrated circuit of claim 1, wherein the processing elements are selected from a plurality of specific architectures, the plurality of architectures including rigid architectures and programmable-rigid architectures.

5. The reconfigurable integrated circuit of claim 4, wherein analysis means are used to determine where logic circuit means needs to be inserted in one or a plurality of processing elements in order to break undesirable combinatorial loops.

6. The reconfigurable integrated circuit of claim 4, wherein an initial selected routing of the reconfigurable interconnect means and the control signal inputs of processing elements can be altered during a single clock cycle based on the results of intermediate processing elements within a combinatorial datapath function allowing the implementation of an adaptive datapath.

7. The reconfigurable integrated circuit of claim 4, wherein the rigid architectures are selected from a plurality of specific architectures, the plurality of architectures including functions for fixed point arithmetic operations, floating point arithmetic operations, logical operations, shift operations, memory, interfaces, input operations, output operations, bit-level manipulations, combinatorial, synchronous and asynchronous logic.

8. The reconfigurable integrated circuit of claim 4, wherein the rigid architectures are selected from a plurality of specific architectures, the plurality of architectures including functions for implementing digital filters, Fast Fourier Transforms, Inverse Fourier Transforms, discrete cosine transforms, periodic and non-periodic waveform generation, correlation and convolution functions.

9. The reconfigurable integrated circuit of claim 4, wherein the programmable-rigid architectures are selected from a plurality of specific architectures, the plurality of architectures including functions for fixed point arithmetic operations, floating point arithmetic operations, logical operations, shift operations, memory, interfaces, input operations, output operations, bit-level manipulations, combinatorial, synchronous and asynchronous logic.

10. The reconfigurable integrated circuit of claim 4, wherein the programmable-rigid architectures are selected from a plurality of specific architectures, the plurality of architectures including functions implementing digital filters, Fast Fourier Transforms, Inverse Fourier Transforms, discrete cosine transforms, periodic and non-periodic waveform generation, correlation and convolution functions.

11. The reconfigurable integrated circuit of claim 4, wherein a plurality of basic processing elements are grouped to form a more complex processing element.

12. The reconfigurable integrated circuit of claim 4, wherein the rigid architectures and programmable-rigid architectures have different control fields and control field data widths.

13. The reconfigurable integrated circuit of claim 1, wherein a plurality of controller elements and a plurality of processing elements are grouped via connection means to form a shared resource processing block, the connection means including reconfigurable connection means and dedicated connection means.

14. The reconfigurable integrated circuit of claim 1, wherein a controller element and processing element are connected using dedicated interconnection means to form a dedicated resource processing element.

15. The reconfigurable integrated circuit of claim 14, wherein a plurality of dedicated resource processing elements are grouped via interconnection means to form a dedicated processing block.

16. The reconfigurable integrated circuit of claim 1, wherein a controller element and a plurality of processing elements are grouped via interconnection means to form a dedicated resource processing element, the controller element controlling each processing element simultaneously.

17. The reconfigurable integrated circuit of claim 13, wherein the number of controller elements is greater than the number of processing elements for a particular shared resource block.

18. The reconfigurable integrated circuit of claim 17, wherein the plurality of processing elements are clocked at a rate that is at least equal to the number of controller elements in a shared resource block.

19. The reconfigurable integrated circuit of claim 17, wherein the processing elements are statistically multiplexed between the controller elements.

20. The reconfigurable integrated circuit of claim 19, wherein the statistical multiplexing methods are selected from a plurality of statistical multiplexing methods, the plurality of statistical multiplexing methods including round robin, weighted round robin, request-grant, first-come-first-serve and priority based.

21. The reconfigurable integrated circuit of claim 20, wherein out of sequence processing is implemented, controller elements issue control messages to individual processing elements, the processing elements having memory means to store and select the control messages using statistically multiplexer means, the operation to be performed by the processing element and on what data being determined by fields in the control message, the result being transferred to the sending controller element means, which subsequently processes the data in time order based on the value of a time stamp field.

22. The reconfigurable integrated circuit of claim 14, wherein the dedicated resource elements implement digital filters, Fast Fourier Transforms, Inverse Fourier Transforms, discrete cosine transforms, periodic and non-periodic waveform generation, correlation and convolution functions.

23. The reconfigurable integrated circuit of claim 1, wherein the plurality of controller elements and plurality of processing elements are selectively grouped to form a plurality of processing blocks, the plurality of processing blocks including shared resource blocks and dedicated resource blocks.

24. The reconfigurable integrated circuit of claim 23, wherein reconfigurable interconnection means interconnects a plurality of processing blocks to allow the transfer of control and data information between and among the plurality of processing blocks.

25. The reconfigurable integrated circuit of claim 24, wherein the plurality of processing blocks and reconfigurable interconnection means are arranged to form a hierarchical structure.

26. The reconfigurable integrated circuit of claim 24, wherein the plurality of processing blocks and reconfigurable interconnection means are arranged to form a fractal structure.

27. The reconfigurable integrated circuit of claim 1, wherein signal routing is controlled by one or a plurality of reconfigurable interconnect controllers and one or a plurality of controller elements, the reconfigurable interconnect controllers and controller elements having memory means to store one or a plurality of routing configurations.

28. The reconfigurable integrated circuit of claim 27, wherein one signal line is connected electrically to another signal line using a pass transistor, the pass transistor or a group of pass transistors being controlled by an individual output from a reconfigurable interconnect controller or a controller element.

29. The reconfigurable integrated circuit of claim 13, wherein an input to a block or element is dynamically selectable from a group of input signals using multiplexer means and an output signal from a block or element is dynamically selectable from a group of output signals using de-multiplexer means, the de-multiplexer and multiplexer being controlled by a reconfigurable interconnect controller or controller element.

30. The reconfigurable integrated circuit of claim 1, wherein master controller means are provided to transfer configuration data to one or a plurality of micro-code memories and one or a plurality of reconfigurable interconnect memories, the transfers being dynamically operable in real time and non-real time.

31. The reconfigurable integrated circuit of claim 30, wherein the master controller means is formed from one or plurality of processing blocks.

32. The reconfigurable integrated circuit of claim 30, wherein the master controller means is an embedded processor.

33. The reconfigurable integrated circuit of claim 30, wherein the master controller means in an external controller means.

34. The reconfigurable integrated circuit of claim 7, wherein the logic required to implement each state of a finite state machine is configured dynamically in real time, the selection and configuration of a programmable logic array means being controlled by a vector field output from the current state vector output register.

35. The reconfigurable integrated circuit of claim 7, wherein a plurality of finite state machines are implemented using the same next state memory and programmable logic array means, the current state vector for each finite state machine being stored in separate current state output registers, and individually selectable by enable signal means, the next state memory containing next state vectors for each finite state machine having an address which is partially formed from an offset address.

36. The reconfigurable integrated circuit of claim 34, wherein the programmable logic array means are selected from a plurality of programmable logic array means, the plurality of programmable logic array means including functions for and gates, or gates, nand gates, nor gates, exclusive or gates, invertors, mutliplexers and look-up tables.

37. The reconfigurable integrated circuit of claim 1, wherein an algorithm that incorporates functions that can be implemented in parallel is directly mapped to corresponding controller elements and processing elements, the processing elements being able to be concatenated dynamically to form different datapath configurations, enabling the algorithm to be implemented in parallel hardware.

38. The reconfigurable integrated circuit of claim 1, wherein uniform processing elements can be dynamically concatenated to form larger data width processing elements.

39. The reconfigurable integrated circuit of claim 1, wherein one or a plurality of controller element and processing elements are initially configured to implement test logic to test the remaining controller and processing elements, any fault conditions being reported to a master controller so the faulty elements can be excluded from implementing live and operational circuits.

40. The reconfigurable integrated circuit of claim 1, wherein the plurality of controller elements and processing elements are optimised for implementation in audio applications.

41. The reconfigurable integrated circuit of claim 1, wherein the plurality of controller elements and processing elements are optimised for implementation in video applications.

42. The reconfigurable integrated circuit of claim 1, wherein the plurality of controller elements and processing elements are optimised for implementation in telecommunication applications.

43. The reconfigurable integrated circuit of claim 1, wherein reconfiguration and algorithm processing is performed asynchronously, the control and datapath logic being implemented using asynchronous logic circuit means, the asynchronous logic circuit means including bounded delay asynchronous circuit means, delay-insensitive circuit means, Differential Cascode Voltage Switch Logic (DCVSL) and Quasi Delay-Insensitive (QDI) asynchronous circuit means.

44. The reconfigurable integrated circuit of claim 1, additionally comprising a programmable clock generator per processing block, that is controlled by one or a plurality of controller elements, the selected clock frequency being optimally selectable to be proportional to the number of processing elements that form the longest concatenated combinatorial logic datapath, the overall function being performed by the longest concatenated combinatorial logic datapath being completed correctly in a single clock cycle, the selected programmable clock frequency being changeable on a clock cycle by clock cycle basis.

* * * * *